US008791570B2

(12) United States Patent
Watanabe et al.

(10) Patent No.: US 8,791,570 B2
(45) Date of Patent: *Jul. 29, 2014

(54) SEMICONDUCTOR DEVICE HAVING A MULTILAYER INTERCONNECTION STRUCTURE

(75) Inventors: Kenichi Watanabe, Kawasaki (JP); Tomoji Nakamura, Kawasaki (JP); Satoshi Otsuka, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/483,044

(22) Filed: May 29, 2012

(65) Prior Publication Data

US 2012/0261833 A1 Oct. 18, 2012

Related U.S. Application Data

(62) Division of application No. 11/868,102, filed on Nov. 14, 2007, now Pat. No. 8,207,610.

(30) Foreign Application Priority Data

Dec. 19, 2006 (JP) .................................. 2006-341823

(51) Int. Cl.
*H01L 29/04* (2006.01)
(52) U.S. Cl.
USPC ............ 257/758; 257/773; 257/774; 257/775; 257/776
(58) Field of Classification Search
USPC ........................... 257/758, 773, 774, 775, 776
See application file for complete search history.

(56) References Cited

U.S. PATENT DOCUMENTS

| 5,289,036 | A | * | 2/1994 | Nishimoto | 257/774 |
| 5,329,162 | A | * | 7/1994 | Nadaoka | 257/774 |
| 6,580,171 | B2 | * | 6/2003 | Ito et al. | 257/760 |
| 6,650,010 | B2 | * | 11/2003 | Davis et al. | 257/700 |
| 6,936,926 | B2 | * | 8/2005 | Matsubara et al. | 257/774 |

(Continued)

FOREIGN PATENT DOCUMENTS

| CN | 1624896 | 6/2005 |
| JP | 2001-298084 | 10/2001 |

(Continued)

OTHER PUBLICATIONS

"Chinese Office Action", mailed by China Patent Office and corresponding to Chinese application No. 2007-101678515 on Dec. 19, 2008, with English translation.

(Continued)

*Primary Examiner* — Eugene Lee
(74) *Attorney, Agent, or Firm* — Fujitsu Patent Center

(57) ABSTRACT

A semiconductor device includes first and second conductor patterns embedded in a first interlayer insulation film and a third conductor pattern embedded in a second interlayer insulation film, the third conductor pattern including a main part and an extension part, the extension part being electrically connected to the first conductor pattern by a first via-plug, the extension part having a branched pattern closer to the main part compared with the first conductor pattern, the branched pattern making a contact with the second conductor pattern via a second via-plug, each of the main part, extension part including the branched pattern, first via-plug and second via-plug forming a damascene structure.

4 Claims, 24 Drawing Sheets

(56) References Cited

U.S. PATENT DOCUMENTS

| | | | |
|---|---|---|---|
| 6,940,108 B2 * | 9/2005 | Cheng et al. | 257/211 |
| 6,977,435 B2 | 12/2005 | Kim et al. | |
| 7,023,091 B2 * | 4/2006 | Funakoshi et al. | 257/758 |
| 7,042,097 B2 * | 5/2006 | Yao et al. | 257/774 |
| 7,141,881 B2 * | 11/2006 | Takayama et al. | 257/758 |
| 7,180,192 B2 | 2/2007 | Hasunuma et al. | |
| 7,227,266 B2 * | 6/2007 | Wang | 257/774 |
| 7,256,474 B2 * | 8/2007 | Wakayama et al. | 257/620 |
| 7,301,240 B2 | 11/2007 | Hasunuma et al. | |
| 7,348,623 B2 * | 3/2008 | Akiyama | 257/303 |
| 7,365,431 B2 * | 4/2008 | Matsubara | 257/758 |
| 7,439,623 B2 | 10/2008 | Harada | |
| 2003/0160328 A1 | 8/2003 | Matsubara et al. | |
| 2004/0173905 A1 | 9/2004 | Kamoshima et al. | |
| 2004/0222531 A1 | 11/2004 | Fujii | |
| 2005/0127496 A1 | 6/2005 | Kwon et al. | |
| 2005/0146041 A1 | 7/2005 | Watanabe et al. | |
| 2005/0269712 A1 * | 12/2005 | Yamada | 257/775 |

FOREIGN PATENT DOCUMENTS

| | | |
|---|---|---|
| JP | 2003-197623 | 7/2003 |
| JP | 2004-273523 | 9/2004 |
| JP | 2004-296644 | 10/2004 |
| JP | 2005-191540 | 7/2005 |
| JP | 2005-286058 | 10/2005 |
| JP | 2005-353676 | 12/2005 |

OTHER PUBLICATIONS

"Taiwanese Office Action", mailed Nov. 30, 2011 for corresponding Taiwanese Application No. 096137053, with partial English-language translation and Taiwanese attorney's letter in English-language explaining the Office Action.

USPTO, (Lee) Restriction Requirement, Jul. 21, 2009, in parent U.S. Appl. No. 11/868,102 [pending].

USPTO, (Lee) Non-Final Rejection, Sep. 15, 2009, in parent U.S. Appl. No. 11/868,102 [pending].

USPTO, (Lee) Final Rejection, Apr. 22, 2010, in parent U.S. Appl. No. 11/868,102 [pending].

USPTO, (Lee) Notice of Allowance and Notice of Allowability, Oct. 13, 2010, in parent U.S. Appl. No. 11/868,102 [pending].

USPTO, (Lee) Notice of Allowance and Notice of Allowability, Jan. 24, 2011, in parent U.S. Appl. No. 11/868,102 [pending].

USPTO, (Lee) Notice of Withdrawal from Issue Branch, Jun. 1, 2011, in parent U.S. Appl. No. 11/868,102 [pending].

USPTO, (Lee) Non-Final Rejection, Sep. 7, 2011, in parent U.S. Appl. No. 11/868,102 [pending].

USPTO, (Lee) Notice of Allowance and Notice of Allowability, Mar. 21, 2012, in parent U.S. Appl. No. 11/868,102 [pending].

USPTO, (Lee) Restriction Requirement, Apr. 27, 2012, in related U.S. Appl. No. 13/015,594 [pending].

* cited by examiner

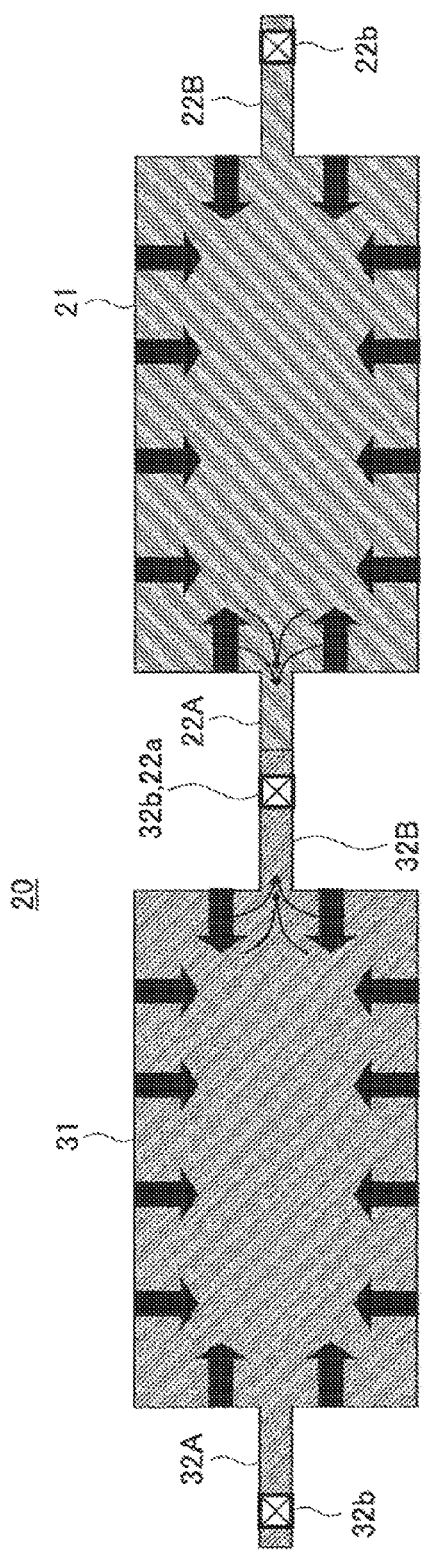

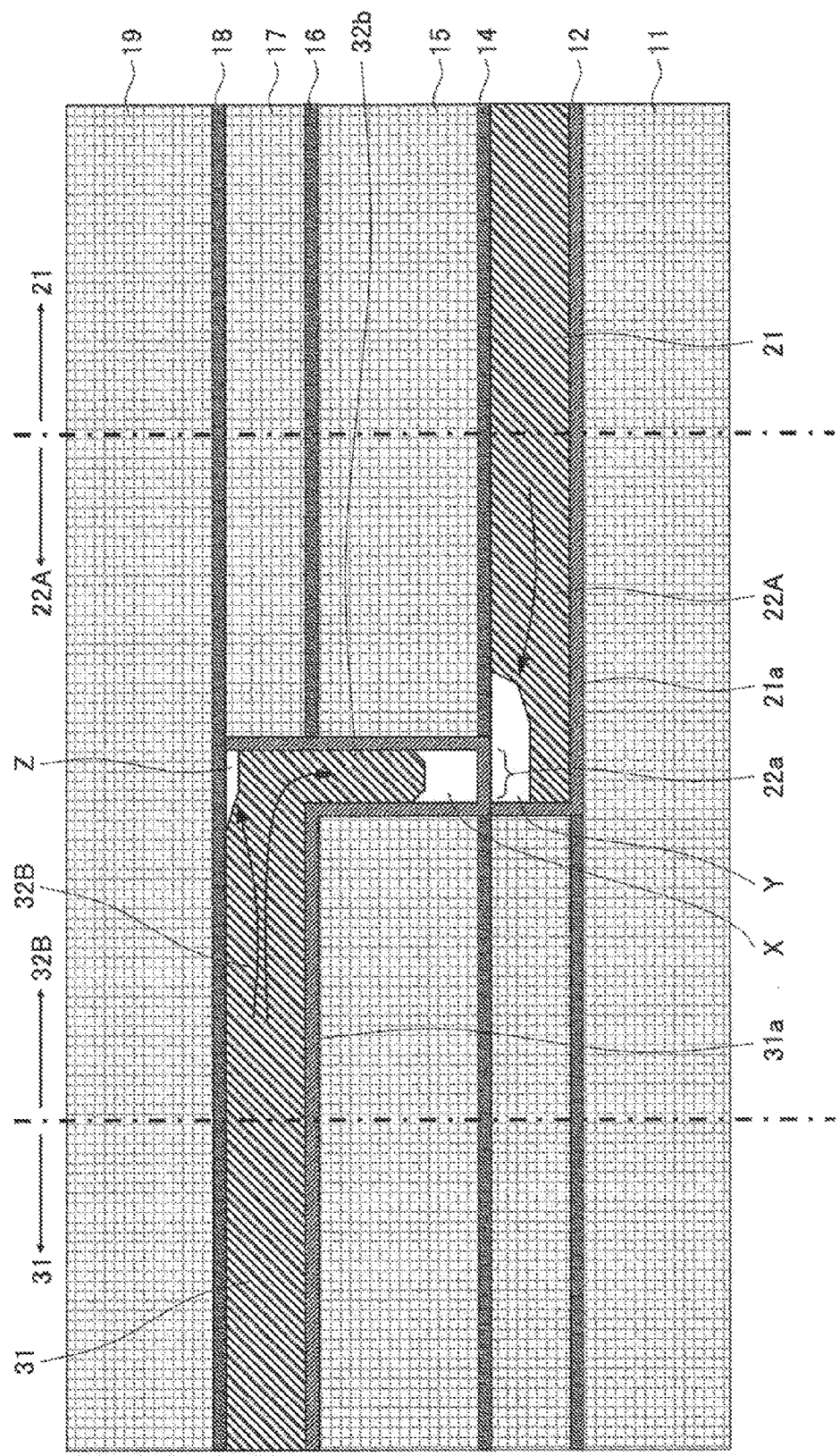

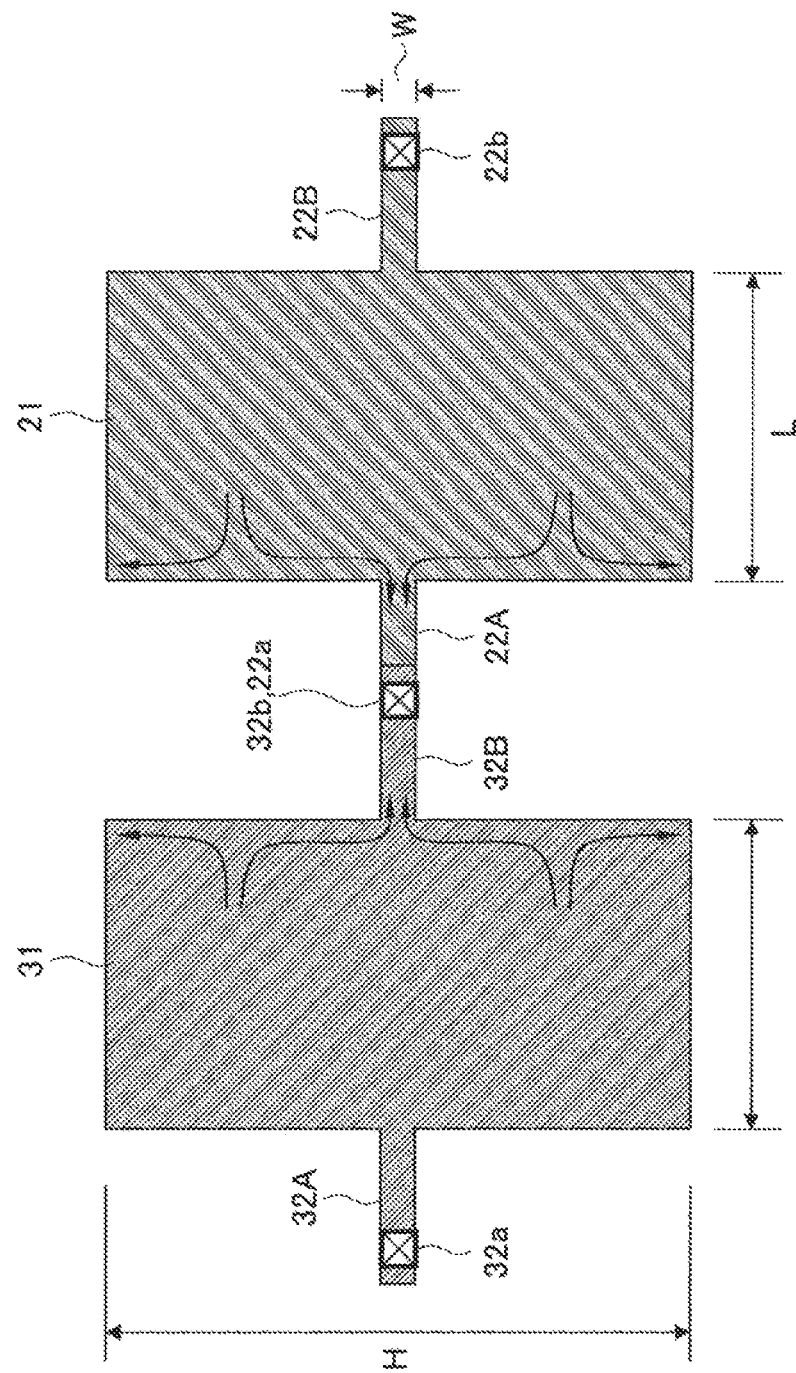

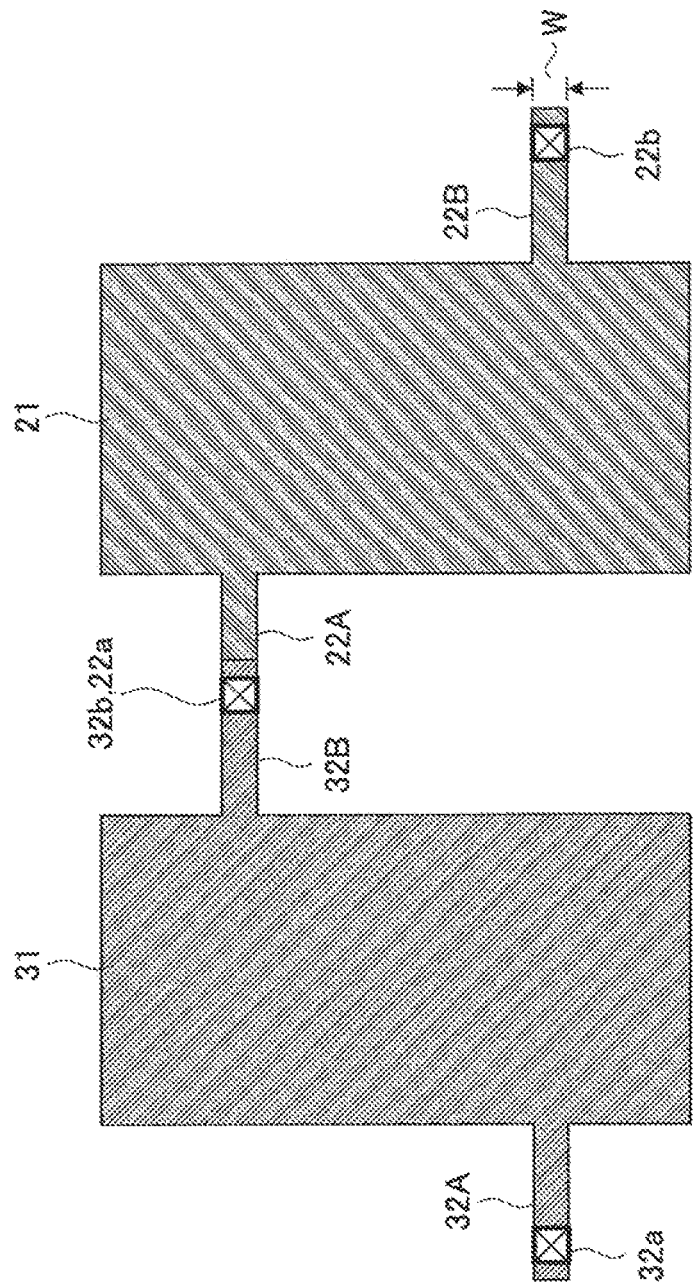

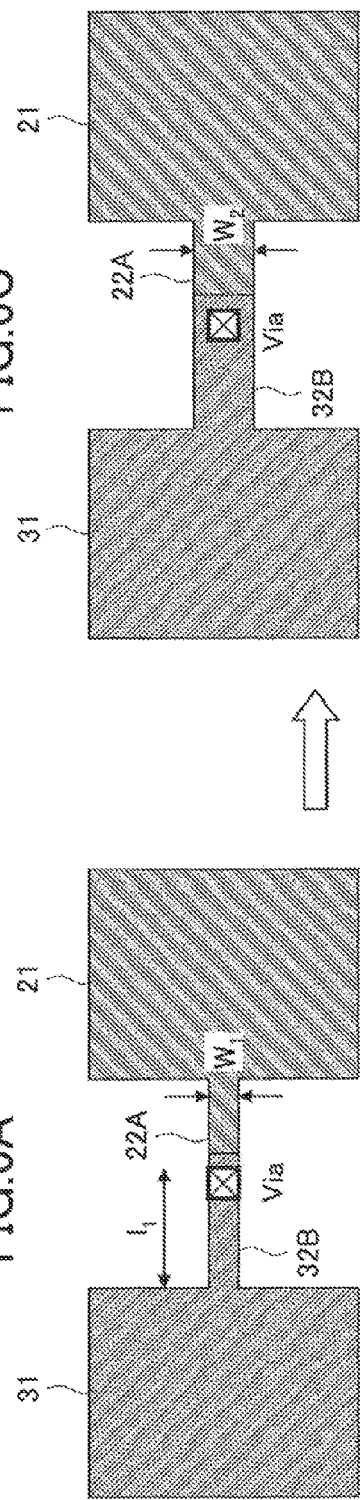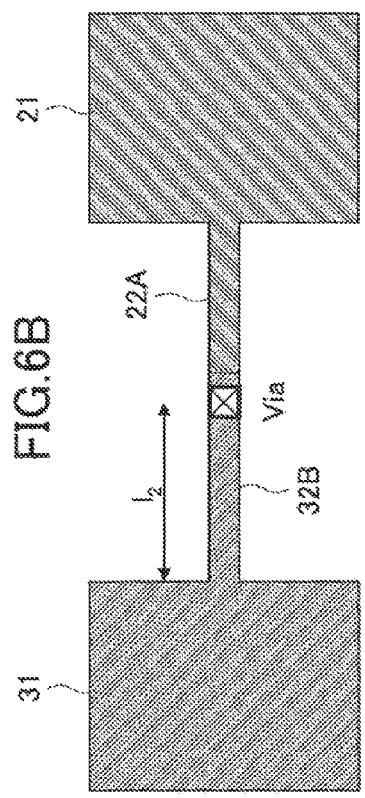

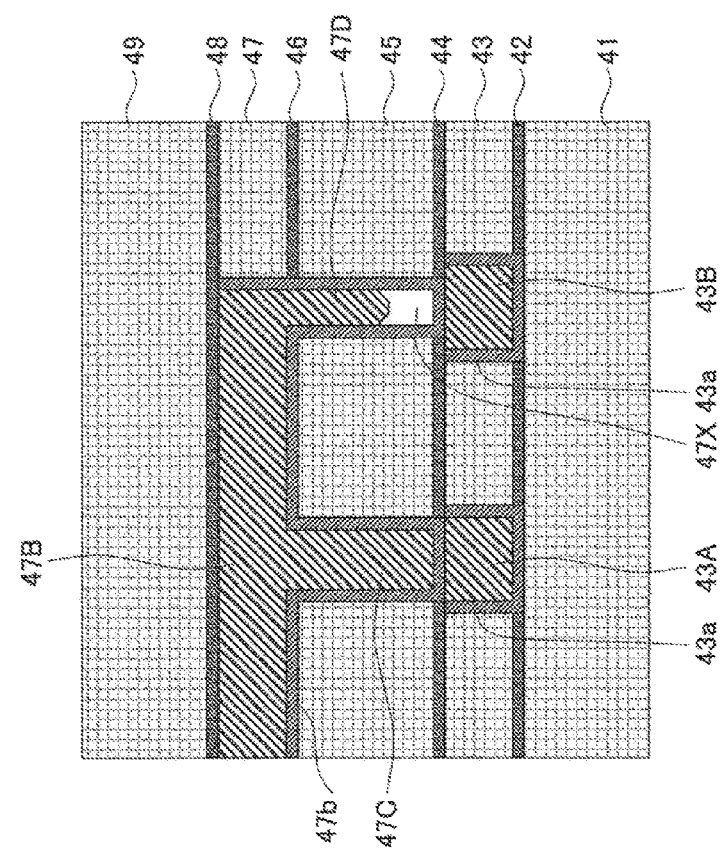
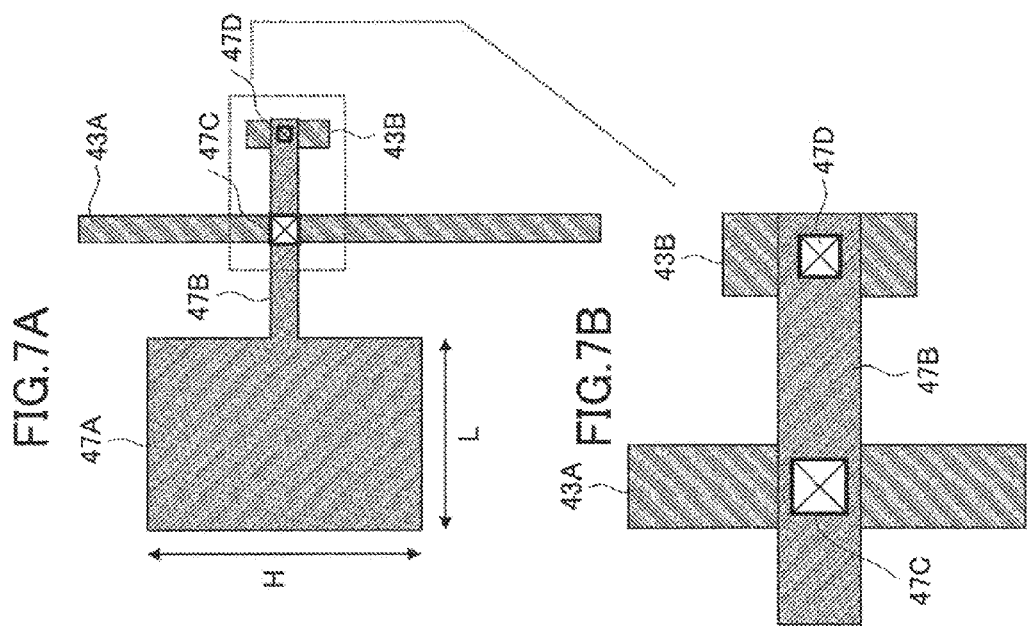

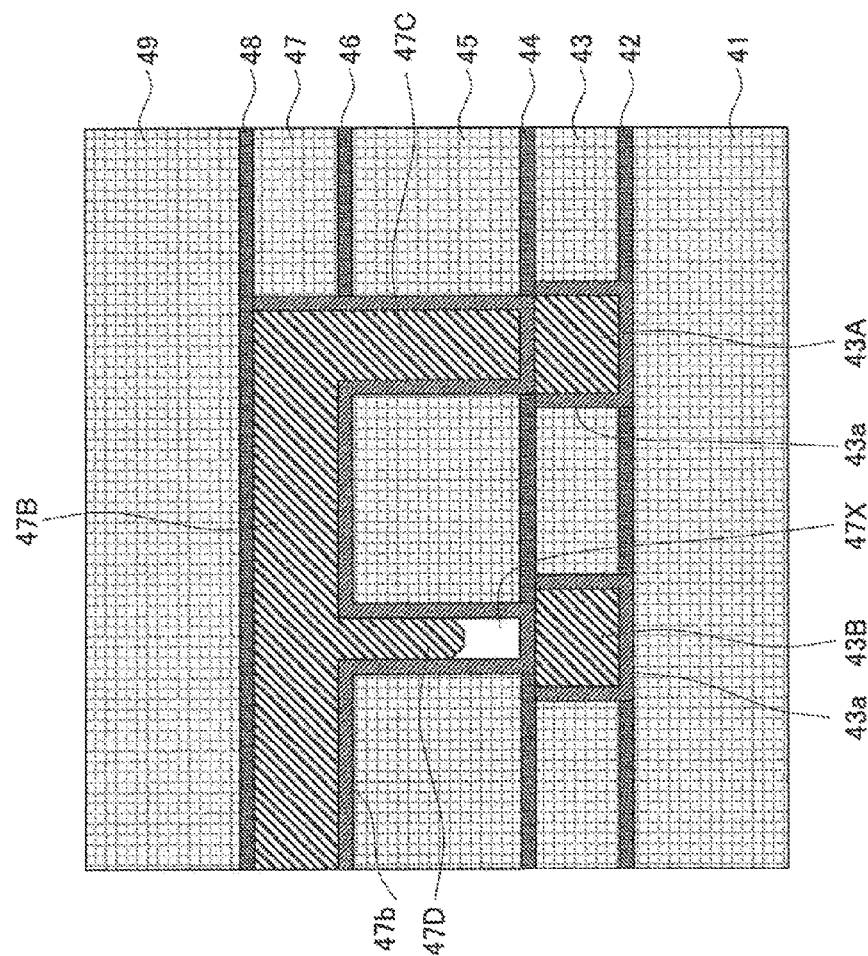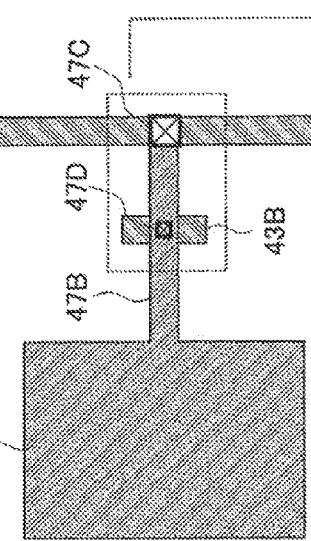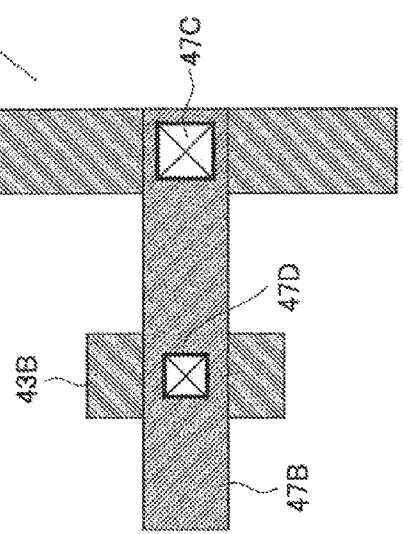

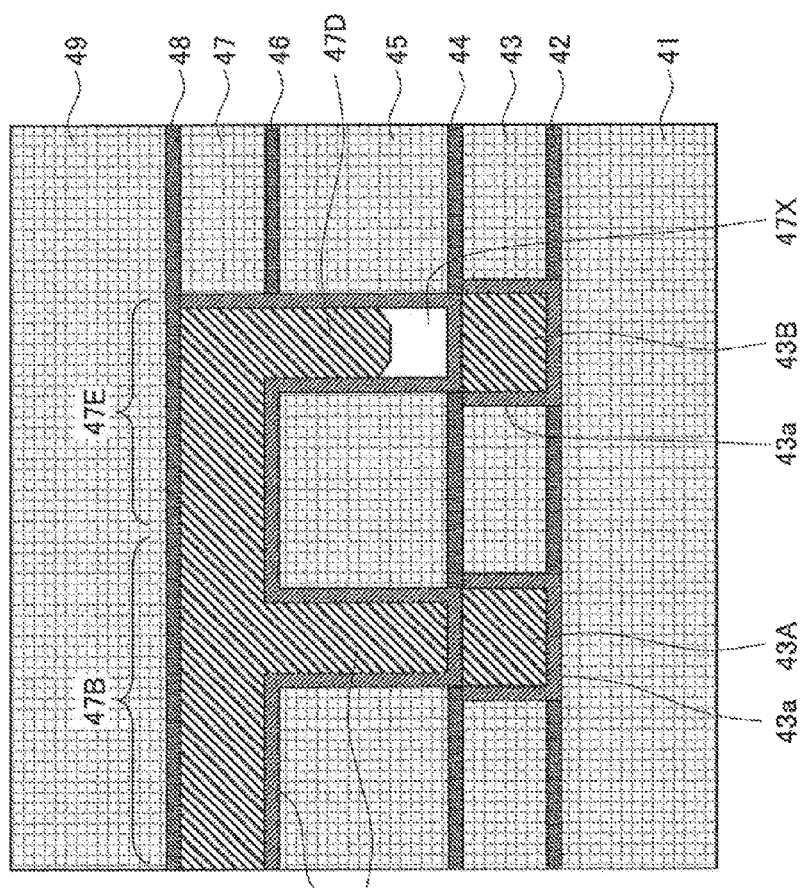
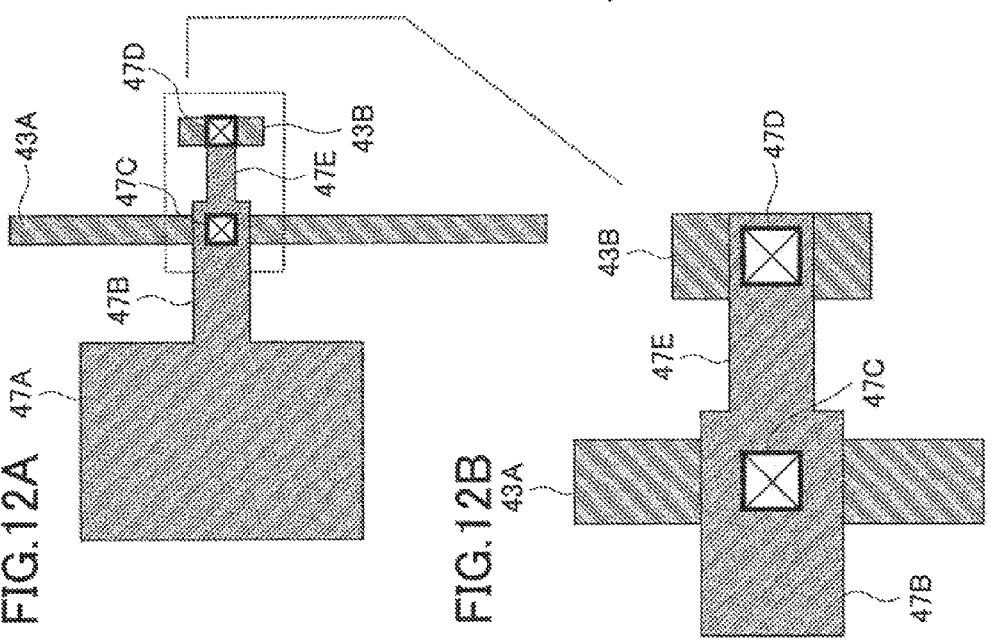

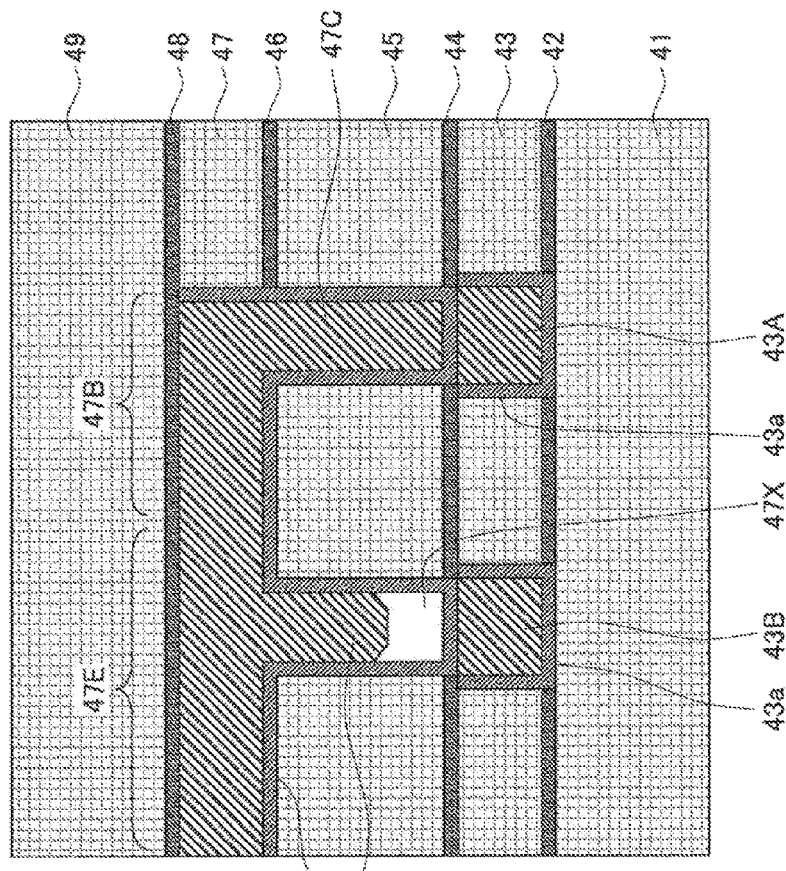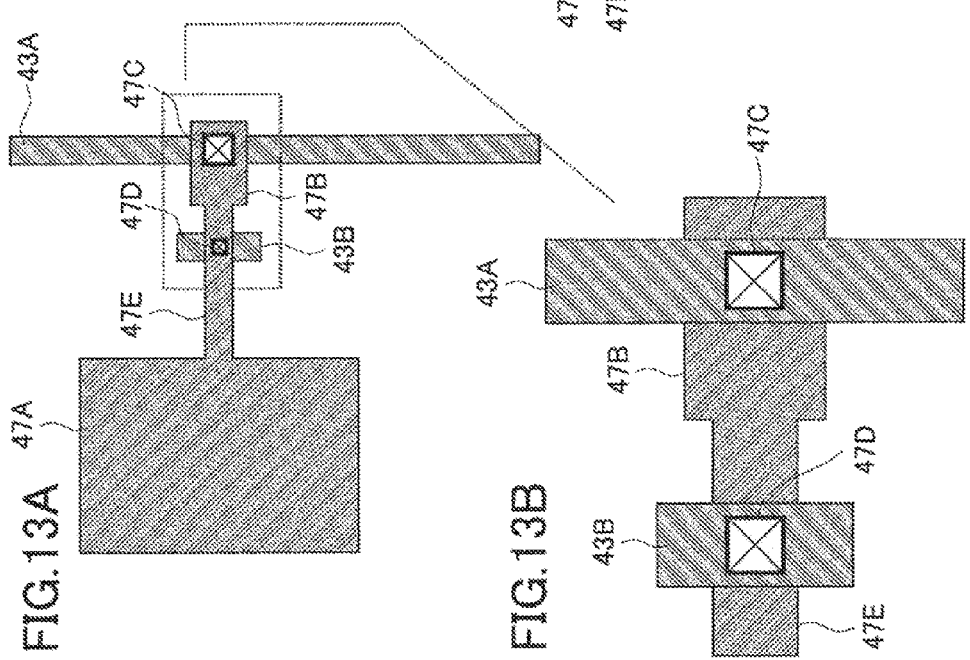
FIG. 13A, FIG. 13B, FIG. 13C

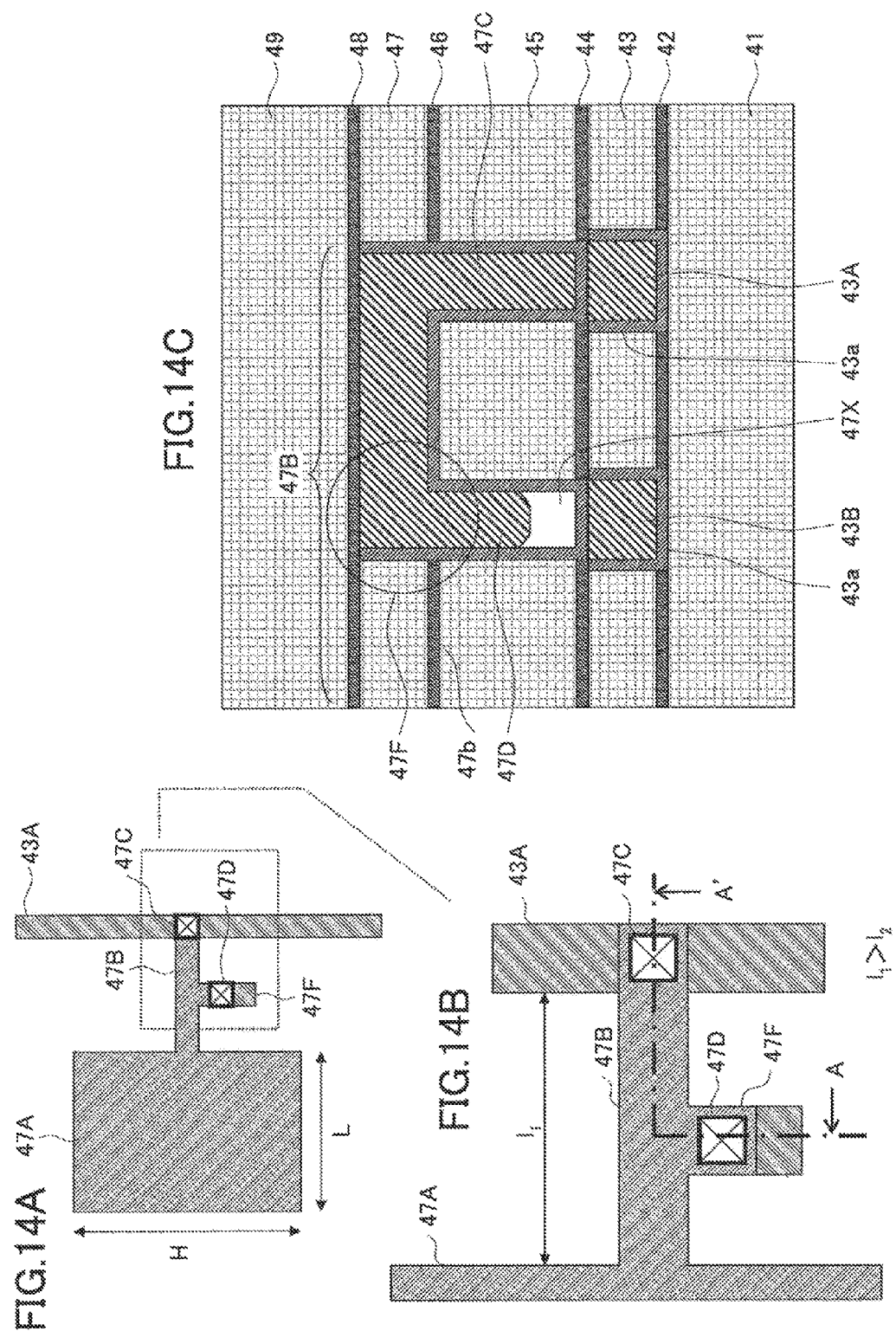

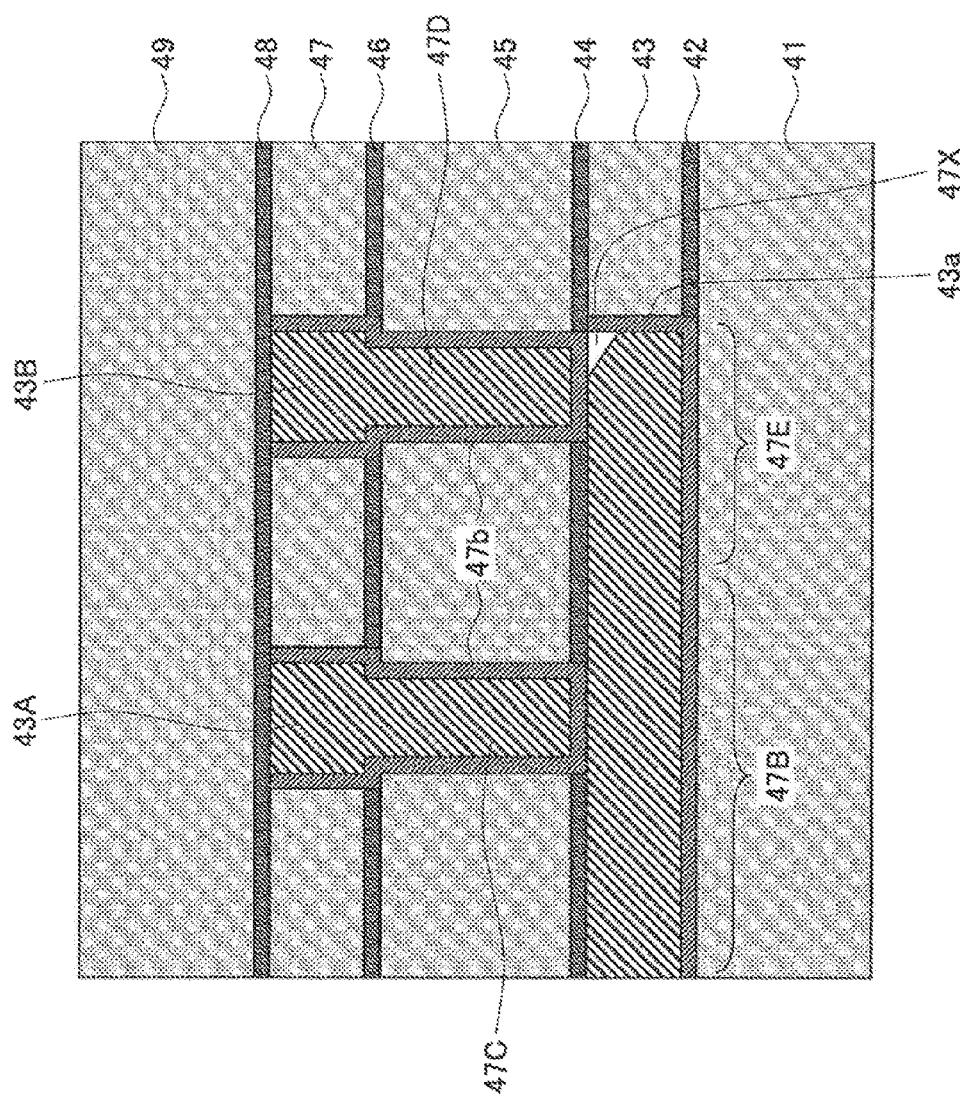
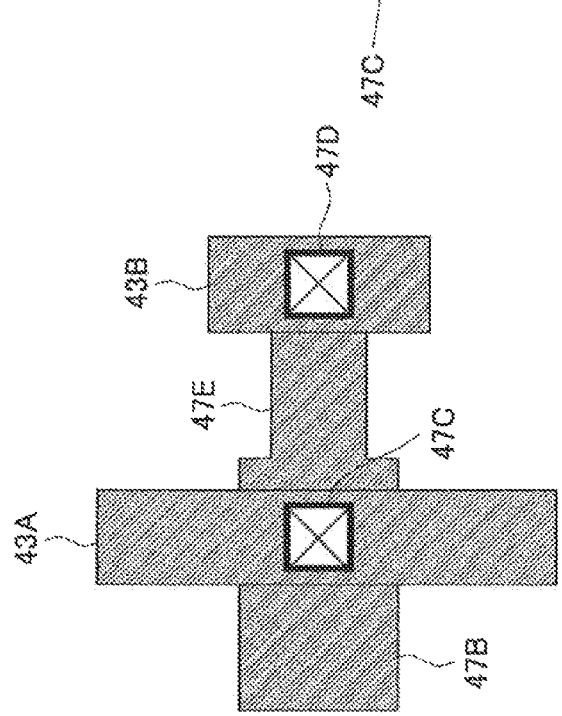
FIG.20B
FIG.20A

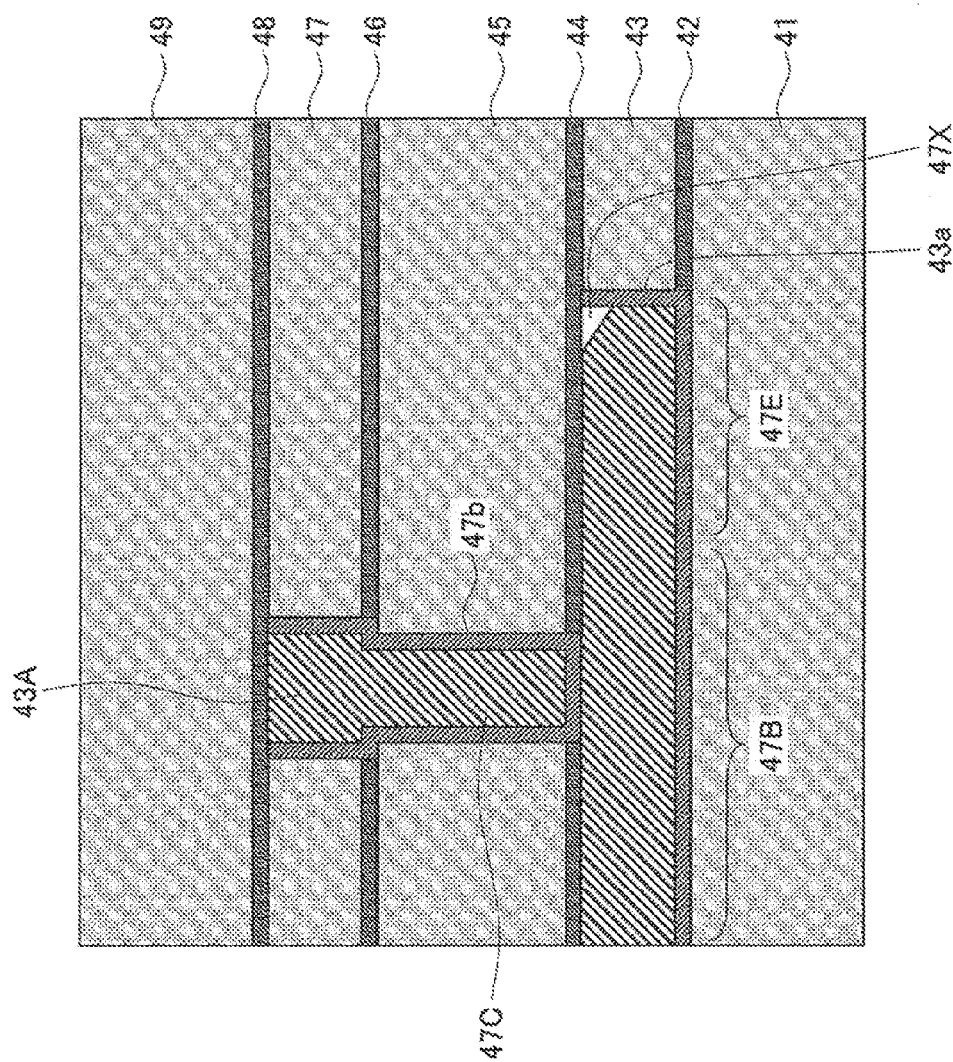
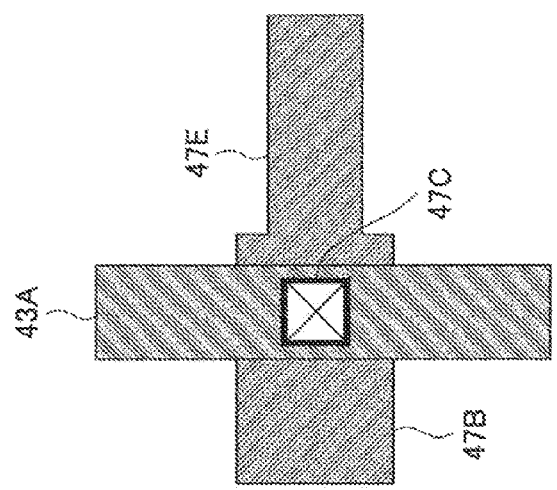
FIG.21B
FIG.21A

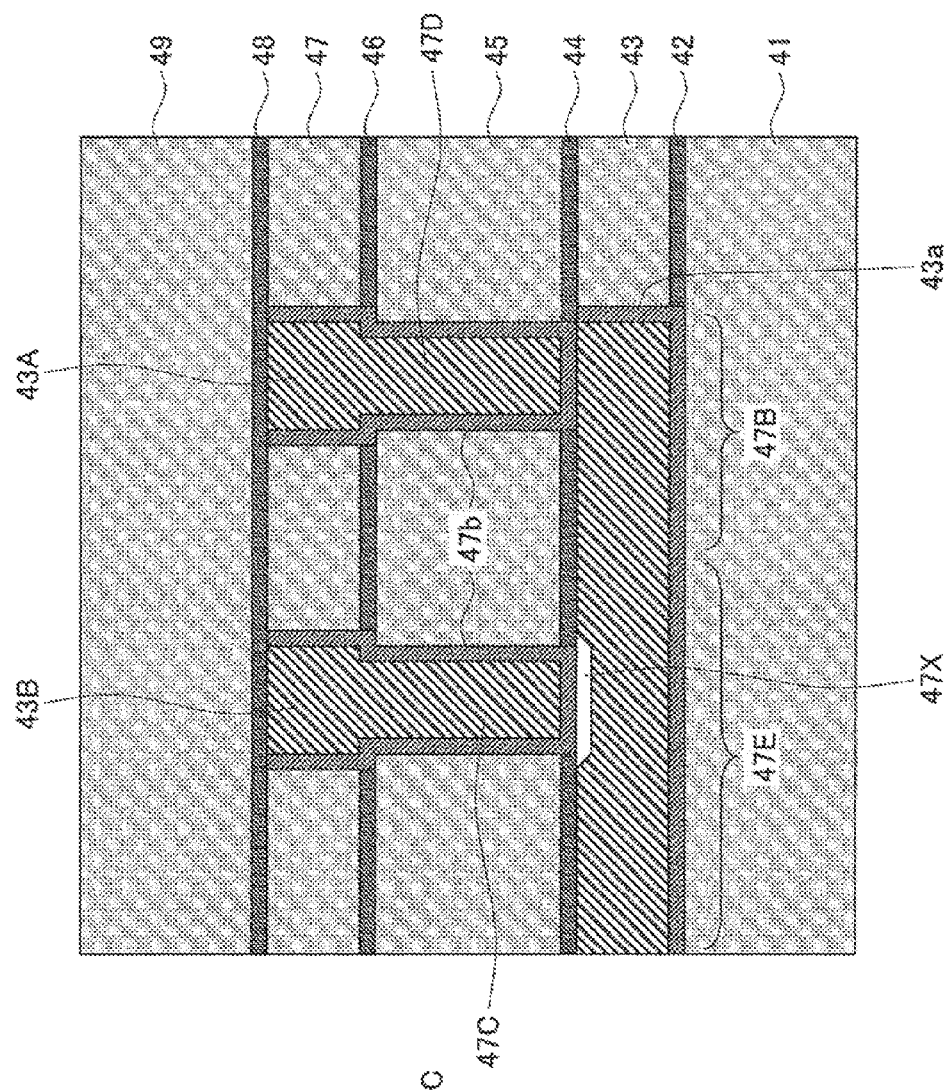
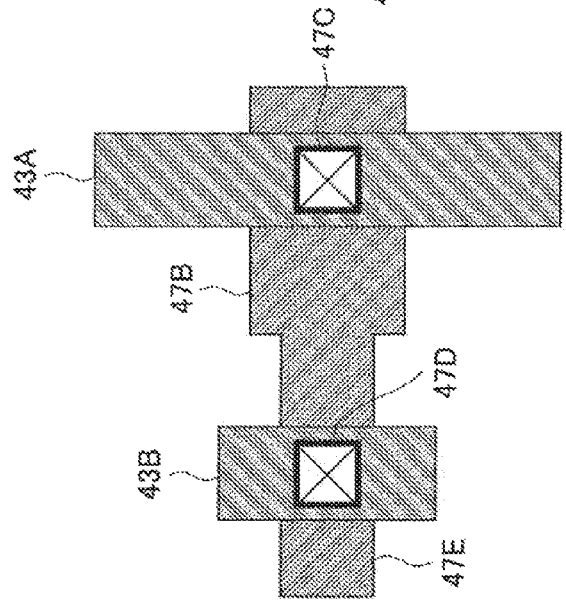
FIG.22B
FIG.22A

SEMICONDUCTOR DEVICE HAVING A MULTILAYER INTERCONNECTION STRUCTURE

CROSS-REFERENCE TO RELATED APPLICATION

The present application is a divisional of application Ser. No. 11/868,102, filed Nov. 14, 2007, which claims priority of Japanese priority application No. 2006-341823 filed on Dec. 19, 2006, the entire contents of which are hereby incorporated by reference.

BACKGROUND OF THE INVENTION

The present invention generally relates to semiconductor devices and more particularly to a semiconductor device having a multilayer interconnection structure.

In highly miniaturized semiconductor devices of these days, so-called multilayer interconnection structure is used for connecting a vast number of semiconductor elements formed on a substrate electrically. In a multilayer interconnection structure, a large number of interlayer insulation films embedded with interconnection patterns are laminated, wherein an interconnection pattern of one layer is connected to an interconnection pattern of an adjacent layer or to a diffusion region in a substrate by way of a contact hole formed in the interlayer insulation film.

Patent Reference 1
Japanese Laid-Open Patent Application 2005-286058
Patent Reference 2
Japanese Laid-Open Patent Application 2005-191540
Patent Reference 3
Japanese Laid-Open Patent Application 2004-296644
Patent Reference 4
Japanese Laid-Open Patent Application 2004-273523
Patent Reference 5
Japanese Laid-Open Patent Application 2003-197623
Patent Reference 6
Japanese Laid-Open Patent Application 2001-298084

SUMMARY OF THE INVENTION

FIG. 1 is a diagram explaining the problems that arise in conventional multilayer interconnection structures.

Referring to FIG. 1, a interlayer insulation film 13 is formed on an insulation film 11 that forms a part of the multilayer interconnection structure via an etching stopper film 12 of SiC, SiN, or the like, and an interlayer insulation film 15 is formed further on the interlayer insulation film 13 via an etching stopper film 14 of SiC, SiN, or the like.

Further, an interlayer insulation film 17 is formed on the interlayer insulation film 15 via a similar etching stopper film 16, and an interlayer insulation film 19 is formed further on the interlayer insulation film 17 via a similar etching stopper film 18.

In the interlayer insulation film 13, there is embedded a conductor pattern 13A such as a Cu pattern in the state in which the sidewall surface and the bottom surface are covered with a barrier metal film 13a of Ta/TaN layered structure, or the like, while in the interlayer insulation film 17, there is embedded a Cu interconnection pattern 17A in the state in which the sidewall surface and the bottom surface are covered with a similar barrier metal film 17a of Ta/TaN layered structure, or the like.

Further, from the Cu interconnection pattern 17A, there extends a Cu via-plug 17B through the interlayer insulation film 15 underneath thereof in the state in which the sidewall surface and the bottom surface thereof are covered by the extension part of the barrier film 17a, wherein the via-plug 17B makes a contact with the conductor pattern 13A in the insulation film 11.

Such Cu interconnection pattern 17A and Cu via-plug 17B are formed respectively in a corresponding interconnection trench in the interlayer insulation film 17 and in a corresponding via-hole in the interlayer insulation film 15, wherein the Cu interconnection pattern 17A and the Cu via-plug 17B are formed by a damascene process, in which the trench for the Cu interconnection pattern 17A and the via-hole for the Cu via-plug 17B are filled with a Cu layer deposited on the interlayer insulation film 17 after covering the surface thereof with the barrier metal film 17a. Further, unnecessary Cu layer on the interlayer insulation film 17 is removed by a CMP process. Particularly, in a dual damascene process, the Cu interconnection pattern 17A and the Cu via-plug 17B are formed simultaneously.

Meanwhile, with the Cu interconnection pattern 17A or via-plug 17B formed with such dual damascene process, it is known that there remains a tensile stress in the interconnection pattern 17A or via-plug 17B as a result of the heat applied at the time of formation of the barrier metal film 17a and as a result of the difference of thermal expansion coefficient between the interlayer insulation film and copper that constitutes the interconnection pattern 17A or the via-plug 17B.

In the case the interconnection pattern 17A or the via-plug 17B accumulates therein residual tensile stress, there is a tendency that Cu atoms cause stress migration with thermal annealing process, or the like, applied thereafter, wherein the Cu atoms tend to migrate from the via-plug 17B of small volume, and hence of small residual stress, to the interconnection pattern 17A of large residual stress. This phenomenon of Cu migration can also be viewed as a flow of vacancies (atomic vacancies) formed in the interconnection layer 17A as a result of the stress migration to the via-plug 17B. As a result, there tends to be caused accumulation of vacancies in the via-plug 17B, especially in the part thereof where the step coverage of the barrier metal film 17a is poor, leading to void formation as a result, while such accumulation of vacancies leads to failure of the contact.

It should be noted that this phenomenon of stress migration is caused also in a conductor pattern 20 shown in the plan view of FIG. 2.

Referring to FIG. 2, the conductor pattern 20 has a wide main pattern 21 and narrow extension parts 22A and 22B extending therefrom, wherein the extension parts 22A and 22B are connected to a conductor pattern of other layer at respective via-contacts 22a and 22b.

Referring to FIG. 2, the interconnection layer of the foregoing other layer is formed on the interconnection layer in which the conductor pattern 21 is included and has a wide main pattern 31 and narrow extension parts 32A and 32B extending from the main pattern 31. In the illustrated example, the extension part 22A of the main pattern 21 is connected to extension part 32B of the main pattern 31 at the via-contact 22a by a via-plug 32b.

FIG. 3 shows the cross-sectional view including the extension parts 22A and 32B of FIG. 2.

Referring to FIG. 3, it can be seen that, in the extension parts 22A and 32B, there occurs formation of a void X at the tip end part of the via-plug 32b as a result of accumulation of vacancies transported from the respective main parts 21 and 31 as shown by arrows, while there occurs formation of a void Y at the via contact 22a at the tip end part of the extension part 21 also as a result of accumulation of vacancies transported from the respective main parts 21 and 31 as shown by an arrow. With the via-plug 32b, it is further conceivable that there is caused formation of a void Z at the base part thereof corresponding to the tip end of the extension part 32B, also as a result of accumulation of the vacancies.

On the other hand, in the investigation that constitutes the foundation of the present invention, the inventor of the present invention has discovered that the defect rate increases for the via-contact in the case the laterally elongating main patterns 21 and 31 in the plane of illustration of FIG. 2 are disposed vertically as shown in FIG. 4 and the vertically elongating main patterns 21 and 31 are connected laterally in the plane of FIG. 4.

In the construction of FIG. 4, for example, it was observed that the defect rate increases by three times when the patterns 21 and 31, having a vertical size H and lateral size L, and the extension parts 22A, 22B, 32A and 32B, having a width W, are formed such that the size H is 20 μm, the size L is 5 μm and the size W is 0.1 μm, as compared with the case in which the size H is 5 μm, the size L is 20 μm and the size W is 0.1 μm.

Further, as shown in FIG. 5, it was observed that there occurs increase of contact defect rate in the case the vertically elongated conductor patterns 21 and 31 are connected in the lateral direction of the drawing.

The results of FIGS. 4 and 5 suggest that such contact defects are caused by the flow of the vacancies taking place in the conductor pattern 31 particularly along the edge part thereof where the extension part 32B is formed as shown in FIG. 4 by the arrows. According to such a mechanism, it is predicted that the amount of the vacancies flowing along the edge, and hence the defect rate, would increase when the length of the edge is increased.

Thus, with such an interconnection structure in which an extension part extends out from a conductor, it is desirable to not use the vertically elongated conductor pattern such as the one shown in FIG. 4, while in actual semiconductor integrated circuit devices, there arise cases in which the use of the pattern like FIG. 4 is inevitable.

Conventionally, various proposals have been made as in Patent References 1-6 for suppressing such stress migration of Cu atoms. In the multilayer interconnection structure of the construction of FIGS. 4 and 5 that connects plural vertically elongated conductor patterns in the lateral direction, however, there is a need for the structure capable of suppressing the flow of the vacancies to the conduct part more efficiently.

In a first aspect of the present invention, there is provided a semiconductor device having a multilayer interconnection structure, said multilayer interconnection structure comprising at least a first interconnection layer and a second interconnection layer formed over said first interconnection layer;

said first interconnection layer comprising a first conductor pattern embedded in a first interlayer insulation film and constituting a part of an interconnection pattern, and a second, another interconnection pattern embedded in said first interlayer insulation film, said second interconnection layer comprising a third conductor pattern embedded in a second interlayer insulation film and constituting a part of said interconnection pattern, said third conductor pattern having an extension part in a part thereof so as to extend therefrom in a layer identical to said third conductor pattern, said third conductor pattern being electrically connected to said first conductor pattern at a first region of said extension part via a first via plug, said extension part making a contact with said second conductor pattern at a second region further away from, or closer to said third conductor pattern with regard to said first region via a second via-plug of a diameter smaller than said first via-plug, said extension part of said third conductor pattern, said first via-plug and said second via-plug forming, together with said second interlayer insulation film, a dual damascene structure.

In a second aspect of the present invention, there is provided a semiconductor device having a multilayer interconnection structure, said multilayer interconnection structure comprising at least a first interconnection layer and a second interconnection layer formed over or under said first interconnection layer, said first interconnection layer comprising a first conductor pattern embedded in a first interlayer insulation film and constituting a part of an interconnection pattern, said second interconnection layer comprising a second conductor pattern embedded in a second interlayer insulation film and constituting a part of said interconnection pattern, said second conductor pattern having an extension part extending in a layer identical to said second conductor pattern, said second conductor pattern being electrically connected to said first conductor pattern at a first part of said extension part by a via-plug, said extension part having a second part extending beyond said via plug, said extension part having a first width in said first part and a second width narrower than said first width in said second part, each of said second conductor pattern, said extension part and said via-plug forming a damascene structure.

In another aspect of the present invention, there is provided a semiconductor device having a multilayer interconnection structure, said multilayer interconnection structure at least comprising a first interconnection layer and a second interconnection layer formed over or under said first interconnection layer, said first interconnection layer comprising a first conductor pattern embedded in a first interlayer insulation film and constituting a part of an interconnection pattern and a second, another conductor pattern embedded in said first interlayer insulation film, said second interconnection layer comprising a third conductor pattern embedded in a second interlayer insulation film and constituting a part of said interconnection pattern, said third conductor pattern having a main part and an extension part extending from said main part in a layer identical to said third conductor pattern, said third pattern being electrically connected to said first conductor pattern at a first region of said extension part by a first via plug, said extension part having a branched pattern branching out in said second interlayer insulation film at a second region closer to said main part as compared with said first conductor pattern, said branched pattern making a contact with said second conductor pattern via a second via-plug, each of said main part of said third conductor pattern, said extension part including said branched pattern, said first via-plug and said second via-plug forming a damascene structure.

In another aspect of the present invention, there is provided a semiconductor device having a multilayer interconnection structure, said multilayer interconnection structure comprising at least a first interconnection layer and a second interconnection layer formed over or under said first interconnection layer, said first interconnection layer comprising a first conductor pattern embedded in a first interlayer insulation film and constituting a part of an interconnection pattern and a second conductor pattern different from said first conductor pattern, said second conductor pattern being embedded in said first interlayer insulation film, said second interconnection layer comprising a third conductor pattern embedded in a second interlayer insulation film and constituting a part of said interconnection pattern, said third conductor pattern having an extension part extending therefrom in a layer identical to said third conductor pattern, said third conductor pattern being connected electrically to said first conductor pattern by a first via-plug at said extension part, said third conductor pattern further having one or more dummy extension parts at an edge from which said extension part extends, each of said one or more dummy extension parts making a contact with said second conductor pattern by a second via-plug, each of said third conductor pattern, said extension part, said one or more dummy extension parts, said first via-plug and said second via-plug forming a damascene structure.

In another aspect of the present invention, there is provided a semiconductor device having a multilayer interconnection structure, said multilayer interconnection structure comprising at least a first interconnection layer and a second interconnection layer provided over or under said first interconnection layer, said first interconnection layer comprising a first conductor pattern embedded in a first interlayer insulation film and constituting a part of an interconnection pattern and a second conductor pattern different from said first conductor pattern embedded in said first interlayer insulation film, said second interconnection layer comprising a third conductor pattern embedded in a second interlayer insulation film and constituting a part of said interconnection pattern, said third conductor pattern having, in a part thereof, an extension part extending therefrom in a layer identical to said third conductor pattern, said third conductor pattern being connected electrically to said first conductor pattern by a first via-plug at said extension part, said third conductor pattern having, in an inner region thereof, a cutout part and a dummy extension part extending in said cutout part, said dummy extension part making a contact with said second conductor pattern via a second via-plug, each of said third conductor pattern, said extension part, said first via-plug and said second via-plug forming a damascene structure.

In another aspect of the present invention, there is provided a semiconductor device having a multilayer interconnection structure, said multilayer interconnection structure at least comprising a first interconnection layer and a second interconnection layer provided over or under said first interconnection layer, said first interconnection layer comprising a first conductor pattern embedded in a first interlayer insulation film and constituting a part of an interconnection pattern, said second interconnection layer comprising a second conductor pattern embedded in a second interlayer insulation film and constituting a part of said interconnection pattern, said second conductor pattern having, in a part thereof, an extension part extending therefrom in a layer identical to said second conductor pattern, said second conductor pattern being connected electrically to said first conductor pattern by a via-plug at said extension part, said second conductor pattern having one or more dummy extension parts on an edge from which said extension part extends, said one or more dummy extension parts having a tip end part formed with a void, each of said extension part, said one or more dummy extension part and said via-plug forming a damascene structure.

According to the present invention, it becomes possible to suppress, in a multilayer interconnection structure of damascene or dual damascene structure, accumulation of vacancies in via-plugs caused by stress migration, by forming an extension part in a conductor pattern connected electrically to an adjacent interconnection layer, and by causing the conductor pattern to make a contact with an interconnection pattern in the adjacent interconnection layer by the via-plug at such an extension part while forming, at the same time, a region where accumulation of vacancies takes place preferentially in the vicinity of the extension part as a trap of the vacancies.

Other objects and further features of the present invention will become apparent from the following detailed description when read in conjunction with the attached drawings.

BRIEF DESCRIPTION OF THE DRAWINGS

FIGS. 2-5 are diagrams explaining the problems addressed by the present invention.

FIGS. 6A-6C are diagrams explaining the principle of the present invention;

FIGS. 7A-7C are diagrams showing a multilayer interconnection structure according to a first embodiment of the present invention;

FIGS. 10A-10C are diagrams showing a multilayer interconnection structure according to a second embodiment of the present invention;

FIGS. 12A-12C are diagrams showing a multilayer interconnection structure according to a third embodiment of the present invention;

FIGS. 13A-13C are diagrams showing a multilayer interconnection structure according to a fourth embodiment of the present invention;

FIGS. 14A-14C are diagrams showing a multilayer interconnection structure according to a fifth embodiment of the present invention;

FIGS. 20A and 20B are diagrams showing the construction of a multilayer interconnection structure according to an eleventh embodiment of the present invention;

FIGS. 21A and 21B are diagrams showing the construction of a multilayer interconnection structure according to a modification of the embodiment of FIGS. 20A and 20B;

FIGS. 22A and 22B are diagrams showing the multilayer interconnection structure according to a twelfth embodiment of the present invention;

DETAILED DESCRIPTION OF THE INVENTION

Principle

Figure 1:
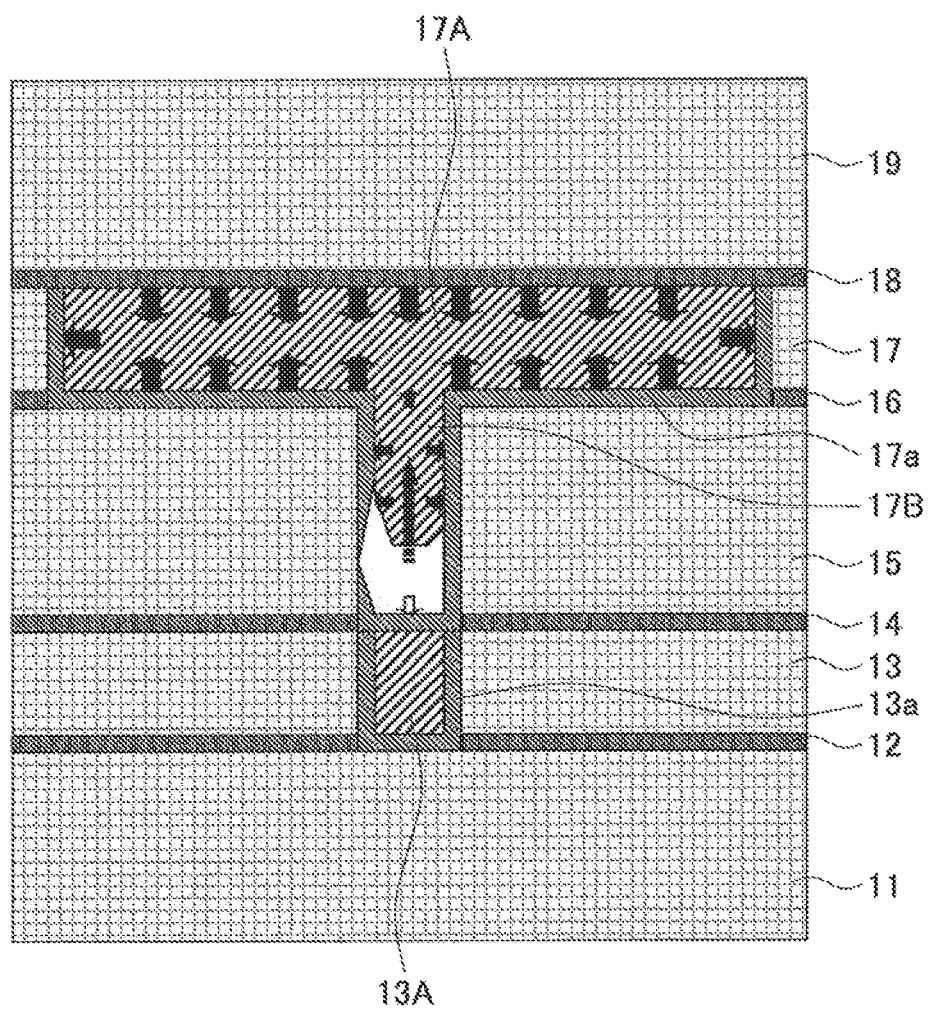
FIG. 1 is a diagram showing a multilayer interconnection structure according to a related art of the present invention.

FIGS. 6A-6C are diagrams showing the principle of the present invention.

Referring to FIG. 6A, this diagram shows a structure corresponding to the structure explained with reference to FIG. 4, wherein the inventor of the present invention has discovered the fact, in the investigation that constitutes the foundation of the present invention, that there appears a tendency in that the defect rate of the via-plug is decreased when the distance l from the conductor pattern 31 to the via-plug is increased as compared with the structure of FIG. 6A as shown in FIG. 6B ($l_2 > l_1$).

Also, in the investigation that constitutes the foundation of the present invention, the inventor of the present invention has discovered that there occurs decrease of defect rate for the via-plugs in the case the width w of the extension part 32B extending out from the conductor pattern 31 and connected to a corresponding extension part of the conductor pattern 21 by a via-plug is increased as compared with the structure of FIG. 6A (w1<w2) as shown in FIG. 6C.

The result of FIG. 6B is interpreted that, as a result of increase of length of the extension part 32B, there is caused an increase of distance for the vacancies to travel for reaching the via-plug by stress migration, and this increase of distance has resulted in the observed decrease of accumulation for the vacancies in the via-plug.

Further, the result of FIG. 6C is interpreted that, as a result of increase of width of the extension part 32B, there is caused a decrease of vacancy concentration in the extension part 32B, while this has resulted in decrease of vacancy accumulation in the via-plug.

Further, in the comparison made for the conductor patterns of the same width, it has been discovered that there is caused more conspicuous accumulation of vacancies in the via-plugs of smaller plug diameter.

Hereinafter, the present invention will be explained with regard to embodiments.

First Embodiment

FIGS. 7A-7C show the construction of a semiconductor device having a multilayer interconnection structure according to a first embodiment of the present invention, wherein it should be noted that FIG. 7A is a plan view diagram of the multilayer interconnection structure, FIG. 7B is an enlarged diagram of the region of FIG. 7A surrounded by a dotted line, while FIG. 7C shows the cross-section of FIG. 7B.

Referring to the cross-sectional diagram of FIG. 7C first, there is formed an interlayer insulation film 43 of inorganic insulation film such as SiOH film or SiOCH film, or alternatively of an organic insulation film, on an insulation film 41 covering a silicon substrate carrying thereon an active device such as MOS transistor (not shown) with a thickness of 200 nm, for example, via an intervening etching stopper film 42 of SiC film or SiN film having a thickness of 50 nm, for example. Further, on the interlayer insulation film 43, there are stacked similar interlayer insulation films 45, 47 and 49 via similar etching stopper films 44, 46 and 48 respectively with the thickness of 300 nm, 200 nm and 300 nm, for example.

In the interlayer insulation film 43, there is embedded a Cu interconnection pattern 43A that constitutes a part of a lower layer interconnection pattern in the state in which the sidewall surfaces and the bottom surface thereof are covered with a barrier metal film 43a of a Ta/TaN stacked structure or a Ti/TiN stacked structure. Further, there is embedded another isolated Cu pattern 43B in the state covered by the same barrier metal film 43a at the sidewall surface and the bottom surface. It should be noted that this isolated Cu pattern 43B is a dummy pattern.

Further, while not illustrated in FIG. 7C, the interlayer insulation film 47 is embedded with a Cu interconnection pattern 47A that constitutes a part of the upper interconnection layer shown in FIG. 7A in the state in which the sidewall surface and the bottom surface thereof are covered by a barrier metal film 47b similar to the barrier metal film 43a, wherein it should be noted that there extends an extension part 47B of Cu from the Cu interconnection pattern 47A in the same interlayer insulation film 47 as shown in FIGS. 7A-7C with a width of 0.1 μm and a length of 0.5 μm, for example, in the state that the sidewall surface and the bottom surface thereof are covered with the barrier metal film 47b.

In the illustrated example, the Cu interconnection pattern 47A is a vertically elongated pattern in the plane of FIG. 7A having a width (L) of 5 μm in the lateral direction and a height (H) of 20 μm in the vertical direction of the plane of the drawing. As explained previously with reference to FIGS. 4 and 5, there tends to be caused contact defects due to stress migration in the via-plugs formed in the extension part laterally extending from such a pattern as explained with reference to FIGS. 4 and 5.

It should be noted that the conductor pattern 47A and the extension part 47B thereof are formed in the interlayer insulation film 47 by a dual damascene process, and thus, have a top principal surface substantially coincident the top principal surface of the interlayer insulation film 47. Further, there extends a Cu via-plug 47C from the extension part 47B through the interlayer insulation film 45 underneath with a diameter of 0.1 μm, for example, in the state covered with the barrier metal film 47b at the bottom surface and the sidewall surface thereof, wherein the Cu via-plug 47C makes a contact with the Cu interconnection pattern 43A.

Further, a similar Cu via-plug 47D extends from the extension part at the region closer to the distal end thereof as compared with the region where the contact via-plug 47C is formed as a dummy via-plug of a diameter of 0.085 μm, for example, wherein the dummy via-plug 47D extends through the interlayer insulation film 45 in the state covered with the same barrier metal film 47b at the sidewall surface and bottom surface thereof and makes a contact with the dummy Cu pattern 43B.

Thus, with the present embodiment, the Cu interconnection pattern 43A extends right underneath the contact via plug 47C in correspondence to the cross-sectional diagram of FIG. 7C as can be seen from FIGS. 7A and 7B, while the dummy Cu pattern 43B is formed right underneath the dummy via-plug 47D.

Thus, with the present embodiment, the dummy via-plug 47D is formed with a smaller diameter as compared width the contact via-plug 47C, and as a result, there occurs preferential accumulation of vacancies migrated from the Cu pattern 47A by stress migration in the dummy via-plug 47D, resulting in formation of a void 47X at the tip end part of the dummy via-plug 47D between the dummy via-plug 47D and the barrier metal film 47b.

It should be noted that such a void 47X functions as a trap of the vacancies and there is caused growth of the void 47X as it traps the vacancies migrated from the Cu interconnection pattern 47 by stress migration.

On the other hand, because of the capturing of the vacancies thus migrated from the Cu pattern 47A by stress migration at the tip end part of the dummy via-pug 47D, accumulation of the vacancies is effectively avoided in the contact via-plug 47C that makes contact with the Cu interconnection pattern 43A. As a result, it becomes possible to form a highly reliable electrical contact between the Cu pattern 47A and the Cu interconnection pattern 43A.

In the present embodiment, it is preferable to set the ratio of cross-sectional area of the dummy via-plug 47D to the contact via-plug 47C to 0.9 or less. On the other hand, from the practical viewpoint, it is preferable that the diameter of the dummy via-plug does not become smaller than 0.08 μm. This is because formation of the dummy via-plug having a designed diameter below exposure limit below which no opening is formed because of too small diameter, becomes extremely difficult. This design diameter value itself, however, is gradually decreased with progress in the technology.

Further, in order to achieve effective capturing of the vacancies by the dummy-via plug 47D, it is preferable to set the distance from the edge of the Cu interconnection pattern 47A from which the extension part 47B extends to the dummy via-plug 47D, such that the distance to the dummy-via plug 47D from the contact via-plug 47C is within 0.5 μm in the plane of the Cu interconnection pattern 47A.

Figure 8A:
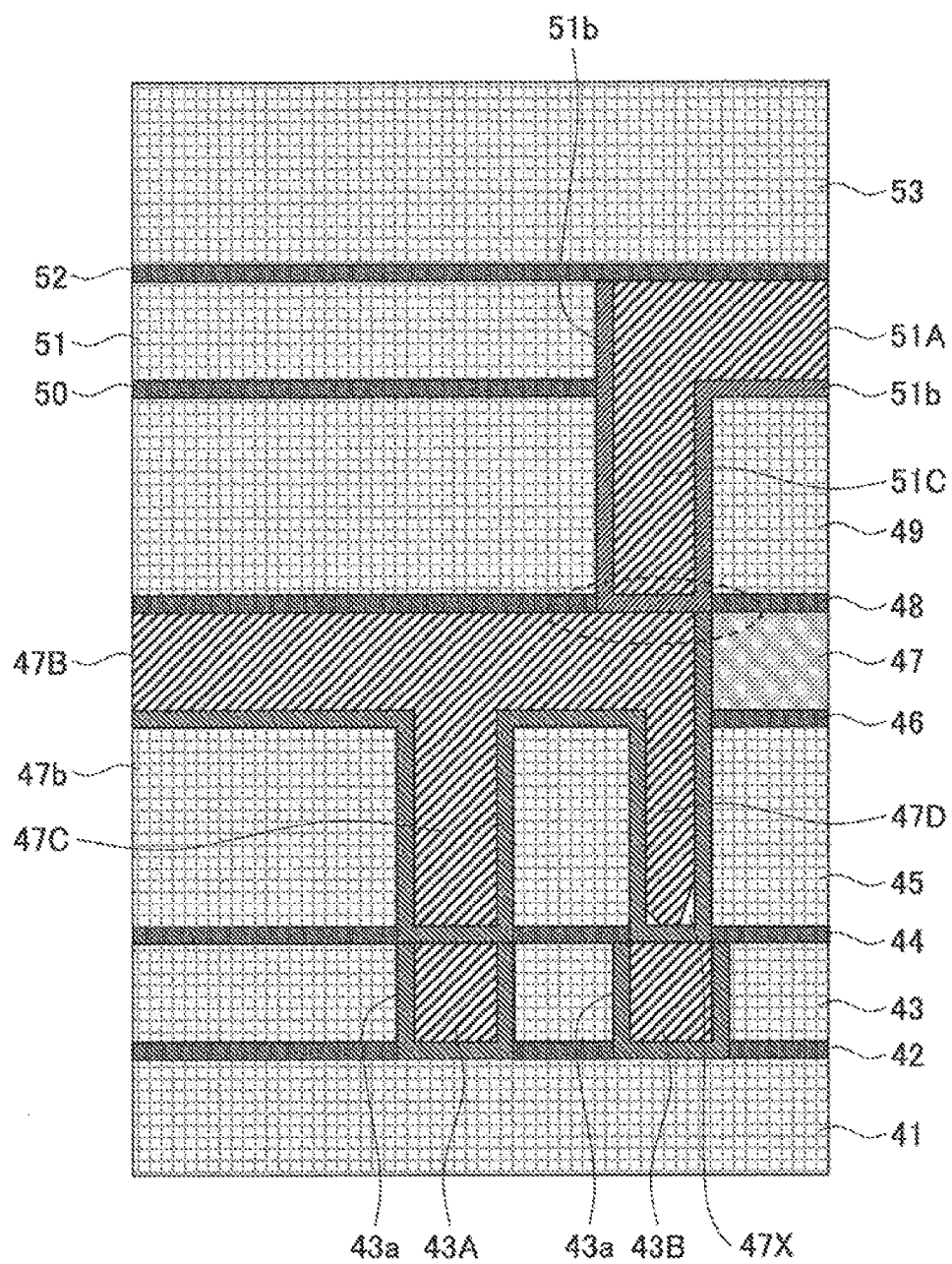
FIG. 8A is a diagram showing a modification of the multilayer interconnection structure of the first embodiment.

FIG. 8A shows an example in which a next interconnection layer is formed on the structure of FIGS. 7A-7C.

Referring to FIG. 8A, there is formed a next interlayer insulation film 51 on the interlayer insulation film 49 via an etching stopper film 50, and a next interlayer insulation film 53 is formed further on the interlayer insulation film 51 via an etching stopper film 52.

In the interlayer insulation film 51, there is embedded an interconnection pattern 51A of Cu, or the like, in the state that the surface thereof is covered by a barrier metal film 51b. From the interconnection pattern 51A, there extends a contact plug 51C through the interlayer insulation film 49 in the downward direction in the state in which the surface of the contact plug 51C is covered with the barrier metal film 51b, wherein the contact plug 51C makes a contact with the extension part 47B via the barrier metal film 51b. Thus, in the example of FIG. 8, the interconnection pattern 51A and the via-plug 51 C are formed by dual damascene process.

With such a construction, the vacancies in the extension part 47B are accumulated at the tip end part of the dummy via-plug 47D to form a void 47X, and as a result, formation of the void Z at the top surface of the extension part 41B including the top end part of the dummy via-plug 47D as explained with reference to FIG. 3 is successfully suppressed. As a result, a highly reliable contact is formed between the via-plug 51C and the extension part 47B.

Figure 8B:
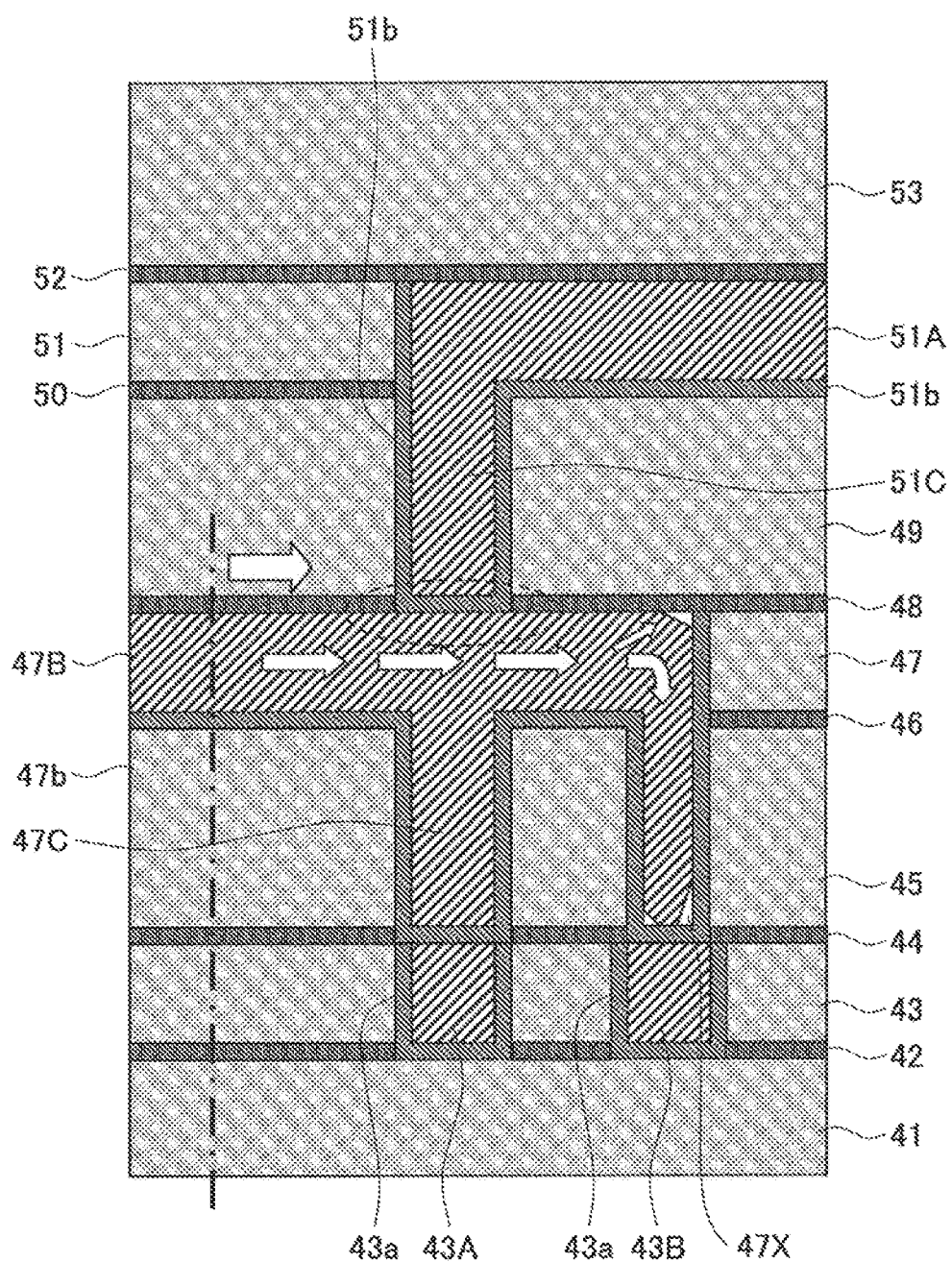
FIG. 8B is a diagram showing another modification of the multilayer interconnection structure according to the first embodiment.

FIG. 8B shows a modification formed by a similar process used for the structure of FIG. 8A. The only difference to the construction of FIG. 8A is that the contact plug 51C is not at the tip end of the extension part 47B but is formed at the side slightly near the Cu interconnection pattern 47A.

With the construction of FIG. 8B, there is attained increased redundancy with regard to the void Y or Z explained with reference to FIG. 3 formed on the top side of the interconnection pattern, while this leads to further improved resistance against stress migration.

Figure 9:
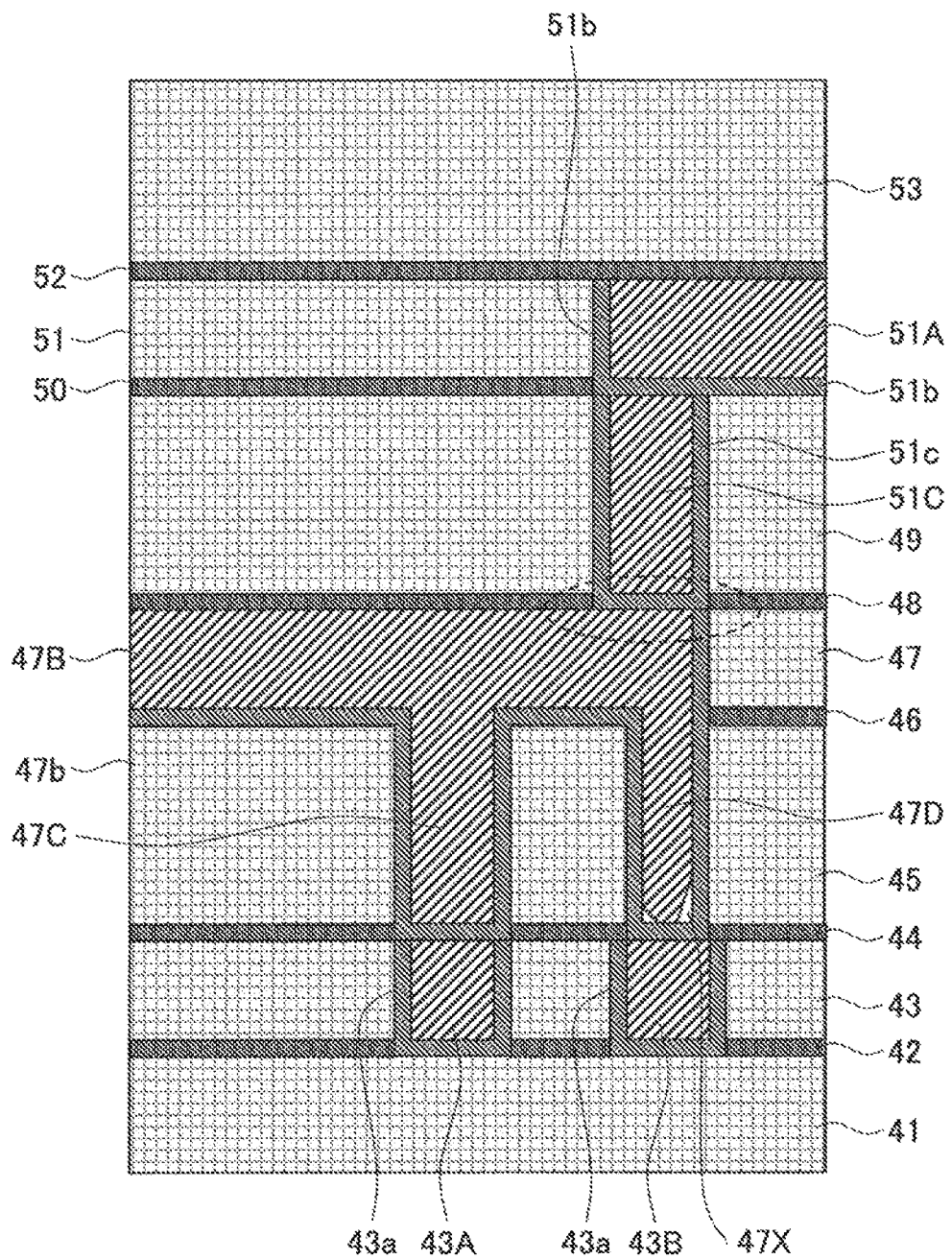
FIG. 9 is a diagram showing a further modification of the multilayer interconnection structure of the first embodiment.

Further, while the interconnection pattern 51A and the via-plug 51C are formed by dual damascene process in the example of FIG. 8A or 8B, it is also possible to form the via-plug 51C separately to the interconnection pattern 51A by a single damascene process as shown in FIG. 9. In the example of FIG. 9, in which the via-plug 51C is formed separately to the interconnection pattern 51A, it should be noted that the via-plug 51C is covered with a barrier metal film 51c different from the barrier metal film 51b.

It should be noted that the upper interconnection structure shown in FIGS. 8A and 8B and FIG. 9 can be formed similarly in other embodiments to be explained below.

Second Embodiment

FIGS. 10A-10C show the construction of a semiconductor device having a multilayer interconnection structure according to a second embodiment of the present invention, wherein it should be noted that FIG. 10A is a plan view diagram of the multilayer interconnection structure, FIG. 10B is an enlarged diagram of the region of FIG. 10A surrounded by a dotted line, while FIG. 10C shows the cross-section of FIG. 10B.

Referring to FIG. 10A, the semiconductor device of the present embodiment has a construction similar to that of the embodiment of FIGS. 7A-7C, except that the dummy Cu pattern 43B is formed at a near side of the Cu interconnection pattern 43A with regard to the Cu interconnection pattern 47A, and that the dummy via-plug 47D is formed on the extension part 47B at the location closer to the Cu interconnection pattern 47A as compared with the contact via-plug 47C. As can be seen in FIGS. 10A and 10B, the Cu interconnection pattern 43A extends right underneath the contact via-plug 47C in correspondence to the cross-section of FIG. 10C and that the dummy Cu pattern 43B is formed right underneath the dummy via-plug 47D.

Thus, the vacancies flowing through the extension part 47B by stress migration from the Cu interconnection pattern 47A toward the contact via-plug 47C are captured with the dummy via-plug 47D of small diameter, and it becomes possible to suppress the accumulation of vacancies in the contact via-plug 47C with further improved efficiency as compared with the previous embodiment.

In the present embodiment, too, it is preferable to set the ratio of cross-sectional area of the dummy via-plug 47D to the contact via-plug 47C to 0.9 or less. On the other hand, from the practical viewpoint, it is preferable to set the diameter of the dummy via-plug 47D to no less than 0.08 μm.

Figure 11:
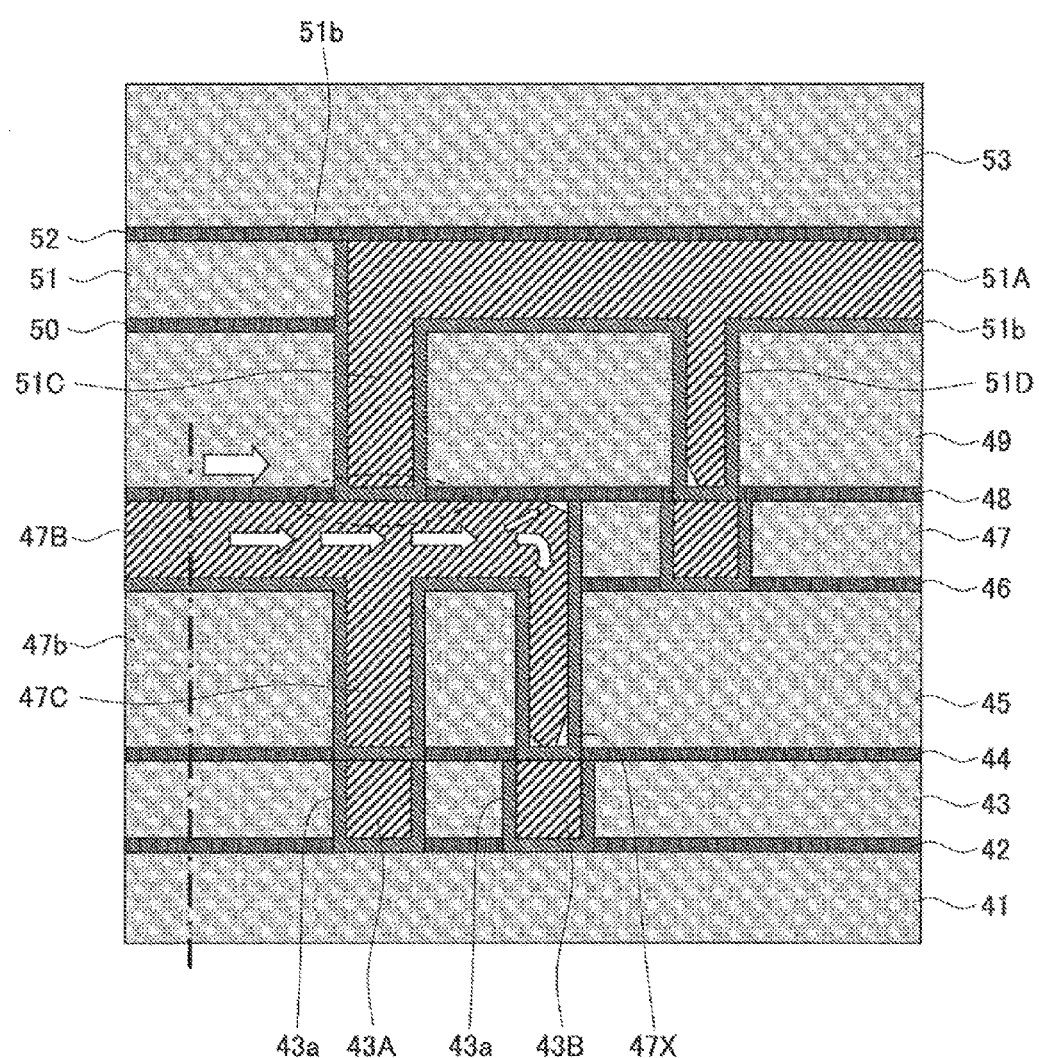
FIG. 11 is a diagram showing a modification of the multilayer interconnection structure according to the second embodiment of the present invention.

FIG. 11 shows a structure according to a modification of the structure of FIGS. 10A-10C formed by a process similar to the case of the modification of FIG. 8B.

Referring to FIG. 11, the only difference to the structure of FIG. 8B is that there is provided another dummy via-plug 51D of redundancy in the upper level interconnection pattern, in addition to the contact plug 51C. Thus, the modification of FIG. 11 can be regarded as a combination of the structure of FIG. 10C with the modification of FIG. 8B.

With the modification of FIG. 11, a redundancy similar to the construction of FIG. 8B is attained for the contact plug 51C and formation of the void X shown in FIG. 3 in the contact plug 51C is suppressed successfully.

By combining the structures of higher redundancy between the upper and lower level interconnection layers as in the case of FIG. 8B or FIG. 11, it becomes possible to realize a structure of high resistance against stress migration. Further, various modifications can be made with regard to the stacking of the upper and lower level interconnection patterns.

Third Embodiment

FIGS. 12A-12C show the construction of a semiconductor device having a multilayer interconnection structure according to a third embodiment of the present invention, wherein it should be noted that FIG. 12A is a plan view diagram of the multilayer interconnection structure, FIG. 12B is an enlarged diagram of the region of FIG. 12A surrounded by a dotted line, while FIG. 12C shows the cross-section of FIG. 12B.

Referring to FIG. 12A, the present embodiment has a construction similar to that of the embodiment of FIGS. 7A-7C explained before, except that the extension part 47B extends over the distance of 0.5 μm with a first width of the 0.15 μm to the via-plug 47C with the present embodiment and that there is formed a second extension part 47E at the tip end part of the extension part 47B with a second, narrow width of 0.1 μm, for example, with a length of 0.5 μm, for example.

Further, with the present embodiment, the dummy via-plug 47D is formed at the tip end part or the second extension part 47E with a diameter identical to that of the contact via-plug 47C. As can be seen in the plan view of FIGS. 12A and 12B, the Cu interconnection pattern 43A extends right underneath the contact via-plug 47C in correspondence to the cross-section of FIG. 12C, and the dummy Cu pattern 43B is formed right underneath the dummy via-plug 47D. Thereby, the dummy via-plug 47D has a diameter identical to that of the contact-via plug 47C with the present embodiment, while the dummy via-plug 47D may also have a diameter smaller than the diameter of the contact-via plug 47C.

By shrinking the width of the second extension part 47E in which the dummy via-plug 47D is formed or by expanding the width of the extension part 47B in which the contact via-plug 47C is formed, there is caused preferential influx of the vacancies into the second extension part 47E from the Cu interconnection pattern 47A as a result of stress migration, wherein the vacancies thus flowed in are captured by the dummy via-plug 47D. With this, defective contact via-plugs 47C are reduced.

With the present embodiment, it is effective to suppress the width of the second extension part 47E to be equal to or smaller than 70-80% of the width of the first extension part 47B for efficient capturing of the vacancies by the dummy via-plug 47D.

In the present embodiment, too, it is preferable to set the distance from the contact via-plug 47C to be 0.5 μm or less in order to attain efficient capturing of the vacancies by the dummy via-plug 47D. Further, it is also possible to form the dummy via-plug 47D with shrinkage over the contact via-plug 47D.

Fourth Embodiment

FIGS. 13A-13C show the construction of a semiconductor device having a multilayer interconnection structure according to a fourth embodiment of the present invention, wherein it should be noted that FIG. 13A is a plan view diagram of the multilayer interconnection structure, FIG. 13B is an enlarged diagram of the region of FIG. 13A surrounded by a dotted line, while FIG. 13C shows the cross-section of FIG. 13B.

Referring to FIG. 13A, the semiconductor device of the present embodiment has a construction similar to that of the embodiment of FIGS. 12A-12C explained before, except that the dummy Cu pattern 43B is formed at a near side of the Cu interconnection pattern 43A with regard to the Cu interconnection pattern 47A, and as a result, the dummy via-plug 47D is formed on the extension part 47B at a location closer to the Cu interconnection pattern 47A with regard to the contact via-plug 47C with the diameter identical to that of the contact via-plug 47C. With this, the second extension part 47E extends directly from the Cu interconnection pattern 47A as shown in FIG. 13A and the extension part 47B is formed at the tip end part of the second extension part 47E.

Because the dummy via-plug 47D is thus formed in the narrow second extension part 47E adjacent to the Cu interconnection pattern 47A with the present embodiment, the vacancies flowing through the extension part 47B by stress migration from the Cu interconnection pattern 47A toward the contact via-plug 47C are captured effectively by the dummy via-plug 47D before reaching the contact via-plug 47C, and it becomes possible to suppress the accumulation of the vacancies in the contact plug 47C with further improved efficiency as compared with the previous embodiments.

As shown in the plan view of FIGS. 13A and 13B, the Cu interconnection pattern 43A extends right underneath the contact via-plug 47C in correspondence to the cross-section of FIG. 13C, and the dummy Cu pattern 43B is formed right underneath the dummy via-plug 47D. While the dummy via-plug 47D has a diameter equal to that of the contact via-plug 47C, the dummy via-plug 47D may have a diameter smaller than that of the contact via-plug 47C in the present embodiment.

In the present embodiment, it is effective for efficient capturing of vacancies by the dummy via-plug 47D to narrow the width of the second extension part 47E by 70% or less of the width of the first extension part 47B.

Fifth Embodiment

FIGS. 14A-14C show the construction of a semiconductor device having a multilayer interconnection structure according to a fifth embodiment of the present invention, wherein it should be noted that FIG. 13A is a plan view diagram of the multilayer interconnection structure, FIG. 14B is an enlarged diagram of the region of FIG. 14A surrounded by a dotted line, while FIG. 14C shows the cross-section of FIG. 14B.

Referring to FIG. 14A, the present embodiment has a construction similar to that of the embodiment of FIGS. 11A-11C explained previously in that there is formed a contact via-plug 47C at a tip end part of the extension part 47B, wherein there extends out a branched pattern 47F from the extension part 47B at an intermediate part between the base part in which the extension part 47B extends from the Cu interconnection pattern 47A and the via-plug 47D. Thereby, the dummy via-plug 47D is formed on the branched pattern 47F with a diameter identical to that of the contact via-plug 47C. With the present embodiment, too, the Cu interconnection pattern 43A extends right underneath the contact via-plug 47C in the plan view of FIGS. 14A and 14B in correspondence to the cross-sectional view of FIG. 14C, and the dummy Cu pattern 43B is formed right underneath the dummy via-plug 47D. While the dummy via-plug 47D has the same diameter as the contact via-plug 47C with the present embodiment, the via-plug 47D may have a smaller diameter.

In present embodiment, the distance $l_2$ measured from the base to the dummy via-plug 47D is shorter than the distance 11 as measured from the same base to the contact via-plug 47C ($l_2 < l_1$), and thus, there occurs efficient accumulation of vacancies transported to the extension part 47B by stress migration from the Cu interconnection pattern 47A in the via-plug 47D, and accumulation of the vacancies is suppressed in the contact via-plug 47C.

Sixth Embodiment

Figure 15:
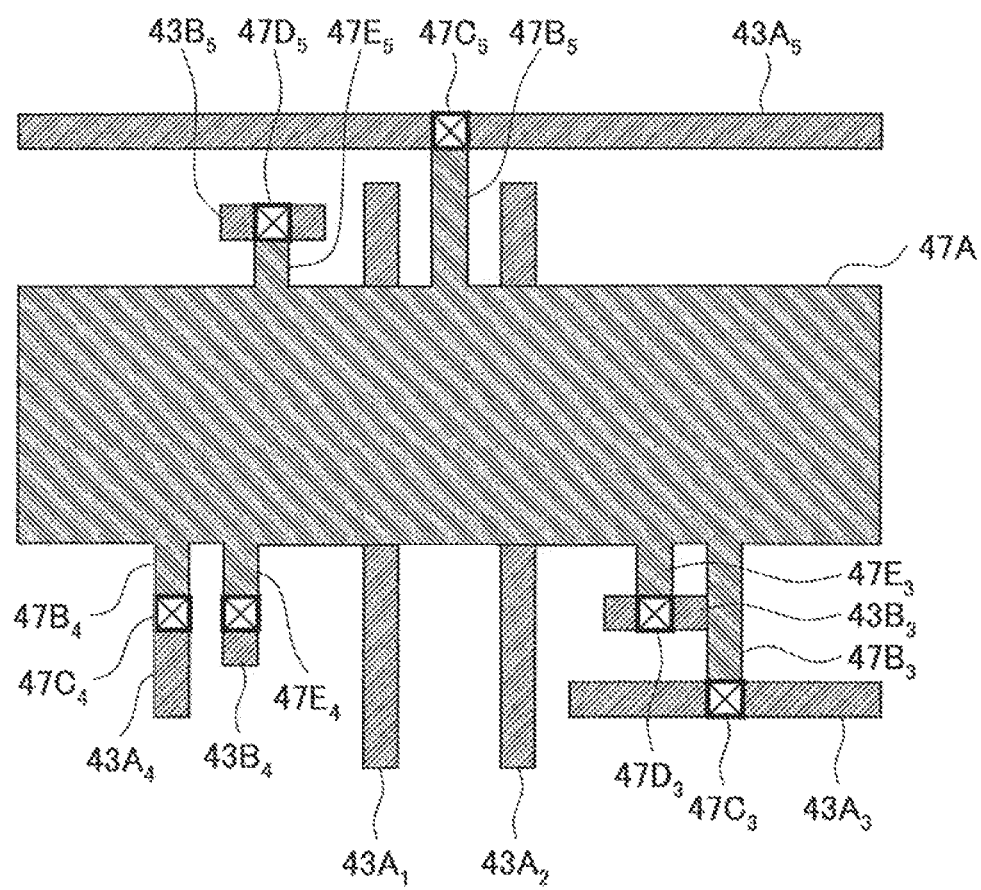
FIG. 15 is a diagram showing a multilayer interconnection structure according to a sixth embodiment of the present invention.

FIG. 15 is a plan view diagram showing the layout of the semiconductor device having a multilayer interconnection structure according to a sixth embodiment of the present invention. In the present embodiment, too, the multilayer interconnection structure has a dual damascene structure similarly to the embodiments explained previously and illustration of cross-sectional view is omitted.

Referring to FIG. 15, the Cu interconnection pattern 47A forms an upper interconnection layer similarly to the previous embodiments while the Cu interconnection patterns 43$A_1$-43$A_5$ form a lower interconnection layer. Further, dummy Cu patterns 43$B_3$-43$B_5$ are formed in the lower layer interconnection layer in the form of isolated Cu patterns.

Similarly to the previous embodiments, there extend extension parts 47$B_3$-47$B_5$ from the Cu interconnection pattern 47A respectively in correspondence to the Cu interconnection patterns 43$A_1$-43$A_5$ and are connected by contact via-plugs 47$C_3$-47$C_5$. Further, with the present embodiment, there extend dummy extension parts 47$E_3$-47$E_5$ from the Cu interconnection pattern 47A respectively in correspondence to the dummy Cu patterns 43$B_3$-43$B_5$ and are connected respectively by via-plugs 47$D_3$-47$D_5$ of the same diameter to the contact via-plugs 47$C_3$-47$C_5$.

With the construction of FIG. 15, it should be noted that the dummy extension part 47$E_4$ is formed adjacent to the extension part 47$B_4$ with the same width and same length, wherein such dummy extension part 47$E_4$ and dummy via-plug 47$D_4$ function to disperse the vacancies that are transported to the extension part 47$B_4$.

Further, with the construction of FIG. 15, the dummy extension part 47$E_3$ is formed in the vicinity of the extension part 47$B_3$ with a shorter length. By accumulating the vacancies to the dummy via-plug 47$D_3$ with high efficiency, the construction of FIG. 15 can provide the effect of suppressing the transport of vacancies to the contact via-plug 47$C_3$.

Further, with the construction of FIG. 15, in which there is formed Cu interconnection patterns 43$A_1$ and 43$A_2$ of lower layer adjacent to the extension part 47$B_5$, it is not possible to form the dummy extension part in close proximity thereof contrary to the case of the dummy extension part 43$E_3$. Thus, with the constitution of FIG. 15, a short dummy extension part 47$E_5$ is formed at the outside of the lower-layer Cu interconnection pattern 43$A_1$ and transport of the vacancies to the extension part 47$B_5$ is reduced by way of concentrating the vacancies to the dummy via-plug 47$D_5$.

Thus, while FIG. 15 shows three, different constructions, any of these three constructions is effective for suppressing the transport of the vacancies to the via-plug by way of the extension part, and the reliability of the via-contact is improved.

Seventh Embodiment

Figure 16:
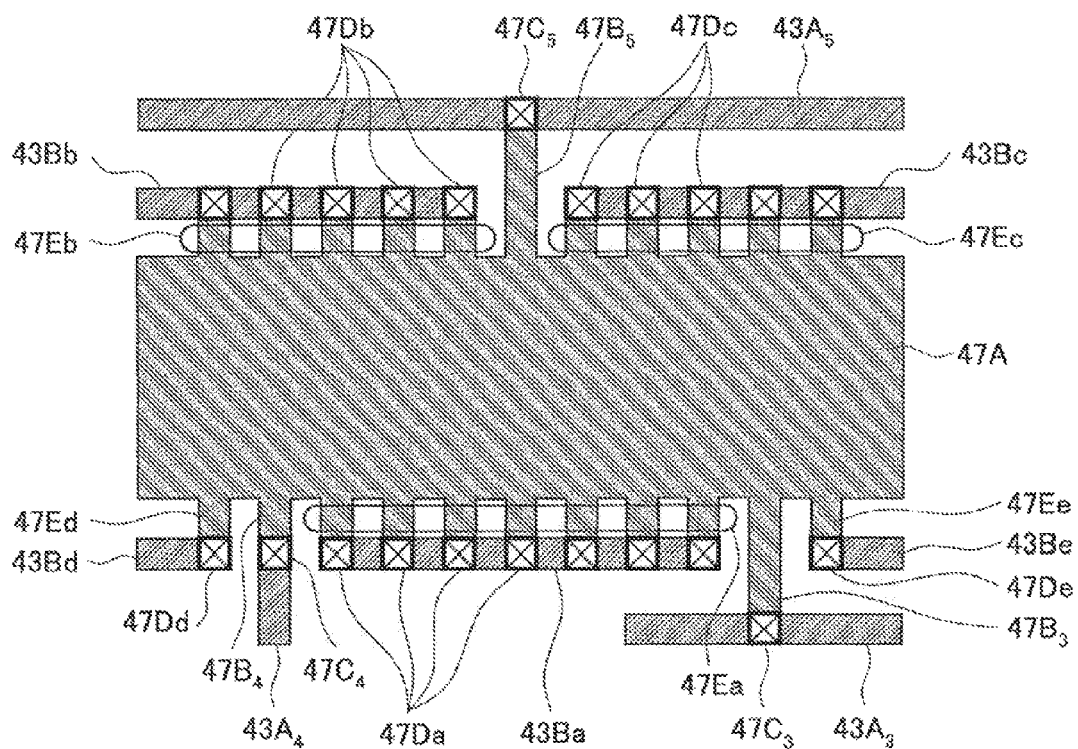
FIG. 16 is a diagram showing multilayer interconnection structure according to a seventh embodiment of the present invention.

FIG. 16 is a plan view diagram showing the layout of the semiconductor device having a multilayer interconnection structure according to a seventh embodiment of the present invention, wherein those parts of FIG. 16 explained previously are designated by the same reference numerals and the description thereof will be omitted. In the present embodiment, too, the multilayer interconnection structure has a dual damascene structure similarly to the previous embodiments and illustration of the cross-sectional view will be omitted.

Referring to FIG. 16, an extension part 47$B_3$ makes a contact with the lower layer Cu interconnection pattern 43$A_3$ via the contact via-plug 47$C_3$ similarly to the previous embodiments, wherein an extension part 47$B_4$ makes a contact to the lower-layer Cu interconnection pattern 43$A_4$ via the contact via-plug 47$C_4$, and an extension part 47$B_5$ makes a contact to the lower-layer Cu interconnection pattern 43$A_5$ via the contact via-plug 47$C_5$, wherein it can be seen that, on the lower-layer interconnection layer, there are formed dummy Cu patterns 43Ba, 43Bb, 43Bc, 43Bd and 43Be along the longer edge of the upper-layer Cu interconnection pattern 47A, and a large number of dummy extension parts 47Ea, 47Eb, 47Ec, 47Ee and 47Ef extending from the Cu interconnection pattern 47A are connected thereto via respective via-plugs 47Da, 47Db, 47Dc, 47De and 47Df.

With the constitution of FIG. 16, it should be noted that the dummy extension parts 47Eb and 47Ec have shorter length than the adjacent extension part 47$B_5$ and are formed with large number, wherein the dummy extension parts 47Eb and 47Ec function to disperse and absorb the vacancies transported along the top edge of the Cu interconnection pattern 47A in the illustration of FIG. 16. Thereby, inflow of the vacancies to the extension part 47B5 is suppressed. Similar dummy extension parts 47Ea, 47Ed and 47Ee are connected to the respective Cu dummy patterns 43Ba, 43Bd and 43Be at lateral sides of the extension parts 47$B_2$ and 47$B_4$ via the dummy via-plug 47Da, 47Dd and 47De, respectively.

With the present embodiment, it becomes possible to facilitate accumulation of the vacancies in the dummy via-plugs 47Da-47Dc by forming the dummy extension parts 47Ea-47Ee to be shorter than the nearby extension parts 47$B_3$-47$B_5$ except for extension part 47$B_4$, and thus by reducing the distance from the interconnection pattern 47A to the dummy via-plugs 47Da-47Dc. With this, transport of the vacancies to the contact via-plugs 47$C_3$-47$C_5$ is suppressed. Thereby, capturing of the vacancies is promoted by increasing the number of such dummy extension parts.

While the extension part 47$B_4$ is formed to have the same length as the dummy extension part 47Ea or 47Ed in the present embodiment, this is merely for the sake of convenience of layout, and it is also possible to form the extension part 47$B_4$ to have a large length similarly to other extension parts.

Eighth Embodiment

Figure 17:
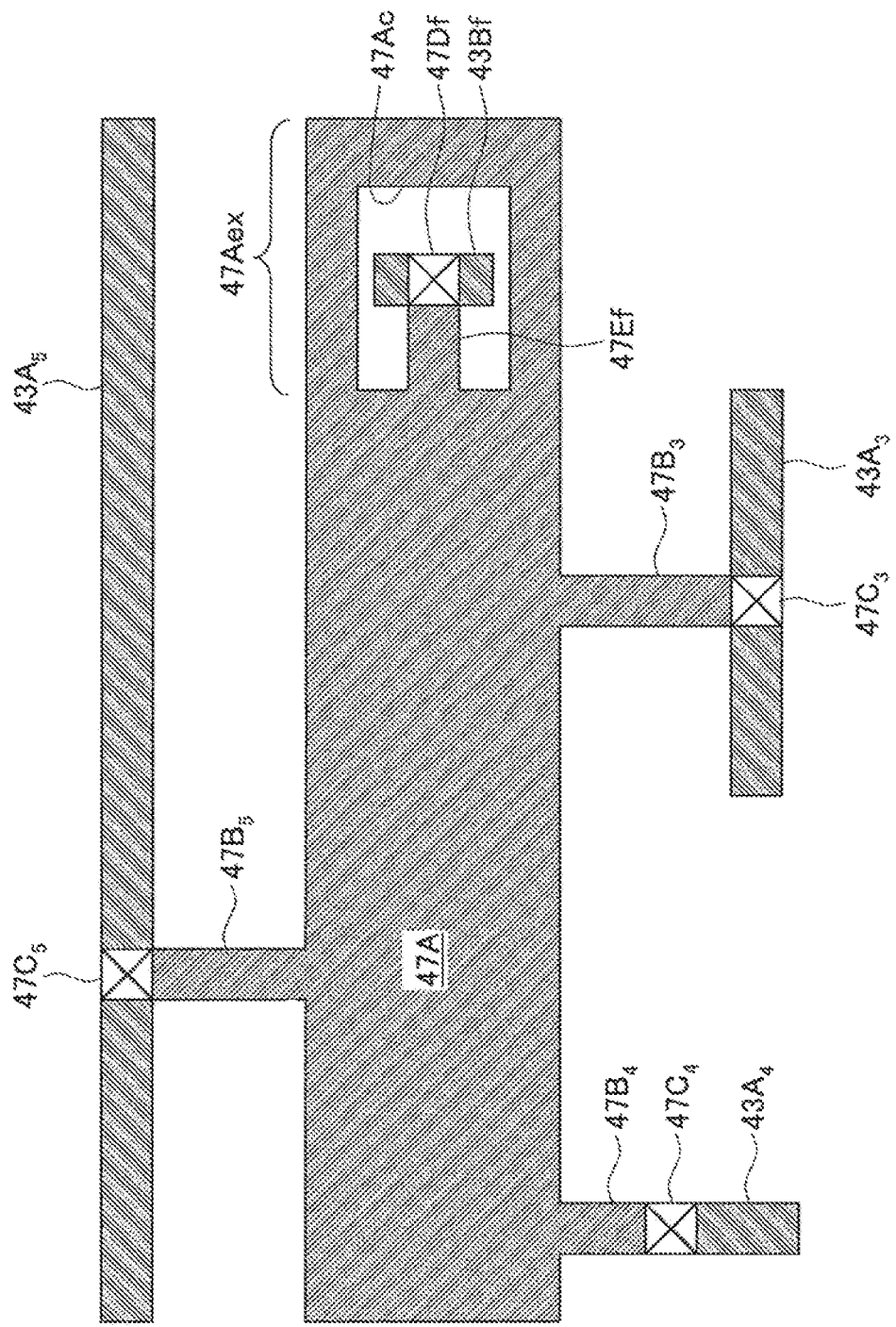
FIG. 17 is a diagram showing the construction of a multilayer interconnection structure according to an eighth embodiment of the present invention.

FIG. 17 is a plan view diagram showing the layout of the semiconductor device having a multilayer interconnection structure according to an eighth embodiment of the present invention, wherein those parts of FIG. 17 explained previously are designated by the same reference numerals and the description thereof will be omitted. Similarly to the various embodiments explained before, the multilayer interconnection structure has a dual damascene structure and illustration of the cross-sectional diagram thereof will be omitted.

Referring to FIG. 17, the present embodiment corresponds to the construction in which the dummy extension part and the corresponding dummy via-plugs and further the dummy Cu patterns are removed in the embodiment of the FIGS. 15 and 16. With the present embodiment, the Cu interconnection pattern is extended at the right edge thereof in the illustration of FIG. 17 to form an extension region 47Aex, and a cutout pattern 47Ac is formed in this part in correspondence to the lower-layer dummy Cu pattern 43Bf formed underneath thereof.

Further, with the embodiment of FIG. 17, there extends a dummy extension part 47Ef into the cut out pattern 47Ac, wherein the dummy extension part 47Ef makes a contact with the dummy Cu pattern 43Bf via the dummy via-plug 47Df.

According to such a construction, it becomes possible to accumulate the vacancies that are formed in the vicinity of the right end part of the Cu interconnection pattern 47A in the dummy via-plug 47Df, and transport of the vacancies to the contact via-plugs $47C_3$-$47C_5$ via the extension parts $47B_3$-$47B_5$ can be reduced.

Ninth Embodiment

While the dummy via-plugs 47D, $47D_3$-$47D_5$, and 47Dc-47Df have been formed with the same diameter as the contact via-plug 47C with the third through eighth embodiments, it is as well possible to form such dummy via-plugs with a smaller diameter as in the case of the first or second embodiment explained previously.

Figure 18:
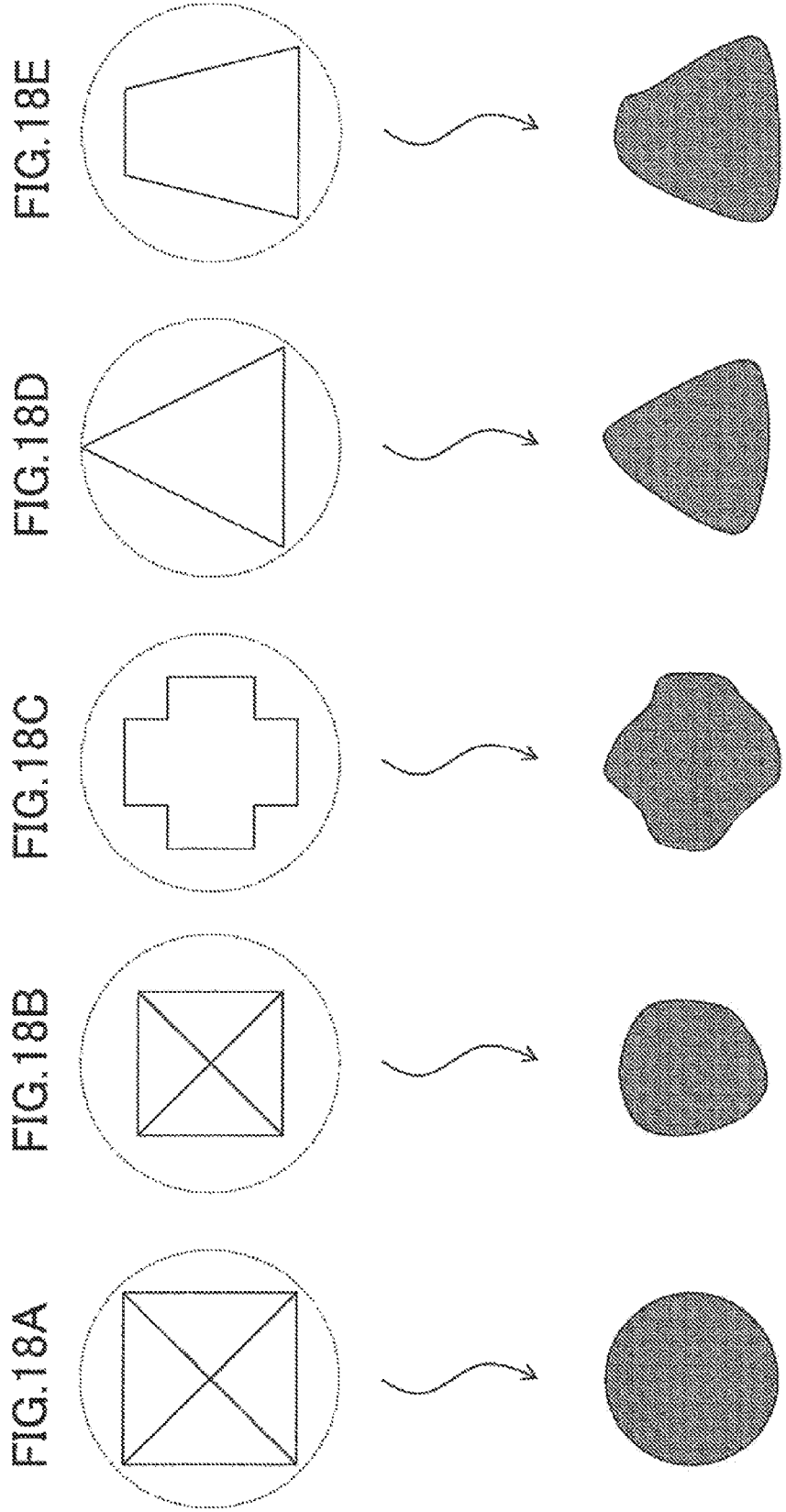
FIGS. 18A-18E are diagrams showing the construction of a multilayer interconnection structure according to a ninth embodiment of the present invention.

In the case of forming such a contact via-plug or a dummy via-plug, it is generally practiced to form the via-hole to have a circular cross-section as shown in the lower part of FIG. 18A while using an exposure pattern of rectangular shape shown in the upper part of FIG. 18A within the exposure limit, while in the case the exposure pattern is demagnified beyond the exposure limit as shown in the upper part of FIG. 18B, the via-hole formed as a result of exposure has a distorted shape from the true circle as showing in the lower part of FIG. 18B.

Thus, with the present embodiment, a via-hole distorted from true circle is formed for the dummy via-plugs 47D, $47D_3$-$47D_5$ and 47Dc-47Df for accumulation of the void that serves for the nuclei of vacancy accumulation by inducing intentional step coverage defect at the time of formation of the via-plugs.

By forming such nuclei for the accumulation of vacancies in the via-holes in which the dummy via-plugs are formed, the present embodiment facilitates effective accumulation of the vacancies to the dummy via-plugs.

Such formation of distorted via-holes is not limited to the example of FIG. 18B but can be attained by using the exposure masks of cross shape, triangular shape, trapezoidal shape, or the like, as shown in FIGS. 18C-18E.

Tenth Embodiment

Figure 19:
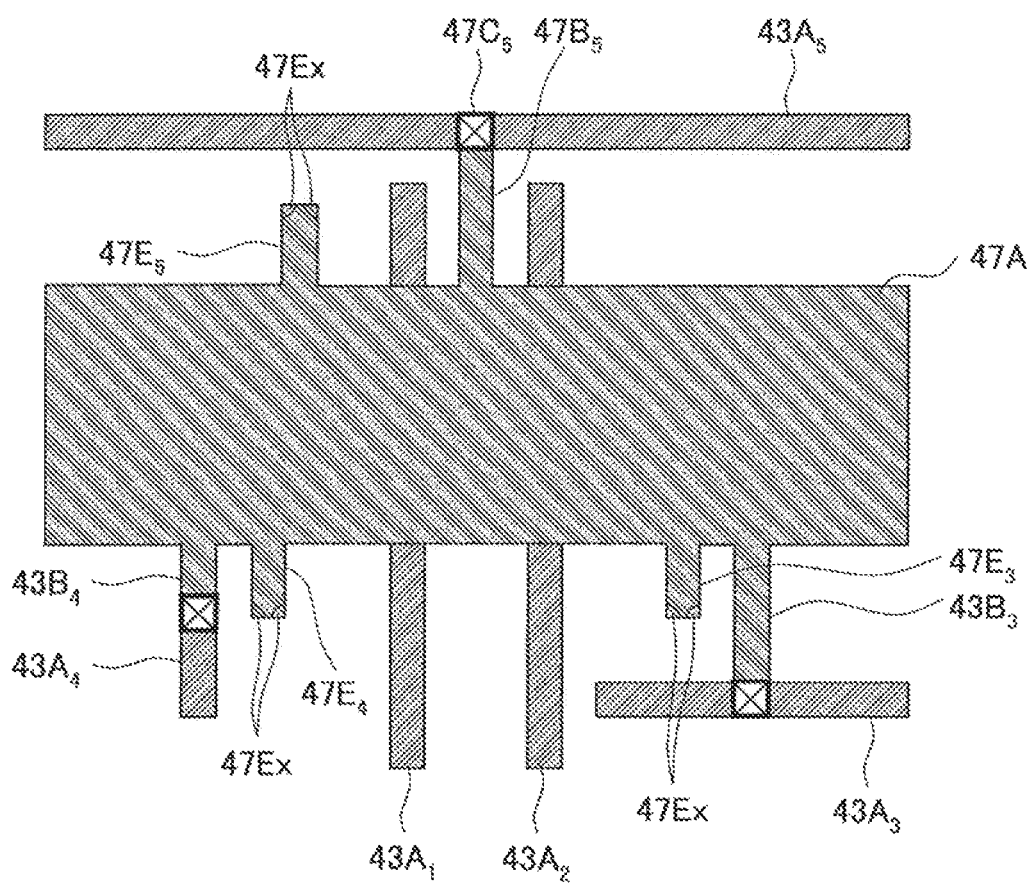
FIG. 19 is a diagram showing the construction of a multilayer interconnection structure according to a tenth embodiment of the present invention.

FIG. 19 is a plan view diagram showing the layout of the semiconductor device has a multilayer interconnection structure according to a tenth embodiment of the present invention, wherein those parts of FIG. 19 explained previously are designated by the same reference numerals and the description thereof will be omitted. Similarly to the embodiments explained previously, the multilayer interconnection structure of the present embodiment also has a dual damascene structure and omit illustration of the cross-sectional view will be omitted.

Referring to FIG. 19, the present embodiment is based upon the construction of FIG. 15 except that the Cu patterns $43B_3$-$43B_5$ of the lower layer and the dummy via-plugs $47D_3$-$47D_5$ are omitted.

Even with such a construction that does not include a dummy via-plug, formation of the void 47Ex is facilitated at the tip end of the dummy extension parts $47E_3$-$47E_5$ as a result of accumulation of the vacancies, and it becomes possible to capture the vacancies particularly effectively by forming the dummy extension parts $47E_3$-$47E_5$ to be shorter than the extension parts $47B_3$-$47B_5$ in which the contact via-holes $47C_3$-$47C_5$ are formed.

While explanation has been made in the foregoing embodiments with regard to the case in which the interconnection layer and the via-plugs in the multilayer interconnection structure are formed of Cu, the present invention is effective also in the case in which other metal that allows processing of dual damascene process such as Al is used for the interconnection layer and the via-plug.

Eleventh Embodiment

FIGS. 20A and 20B are respectively a plan view diagram and a cross-sectional diagram showing the construction of a multilayer interconnection structure according to an eleventh embodiment of the present invention, wherein those parts corresponding to the parts explained previously are designated by the same reference numerals and the description thereof will be omitted.

Referring to FIGS. 20A and 20B, the present embodiment has a construction in which the interconnection layer including the interconnection patterns 43A and 43B and the interconnection layer including the interconnection pattern 47A are interchanged in the multilayer interconnection structure explained with reference to FIGS. 12A-12C such that the interconnection patterns 43A and 43B are formed in the interlayer insulation film 47 and the interconnection pattern 47A is formed in the interlayer insulation film 43.

Thus, the multilayer interconnection structure of the present embodiment has the feature of comprising: at least a first interconnection layer formed in the interlayer insulation film 47 and a second interconnection layer formed in the second interlayer insulation film 43 underneath the first inter connection layer, the first interconnection layer comprising a conductor pattern 43A embedded in the interlayer insulation film 47 and constituting a part of an interconnection pattern and another conductor pattern (dummy interconnection pattern) 43B embedded in the interlayer insulation film 47, the second interconnection layer comprising a conductor pattern (47A, 47B, 47E) embedded in the interlayer insulation film 43 and constituting a part of the interconnection pattern, the conductor pattern (47A, 47B, 47E) having a main part 47A and an extension part (47B, 47E) extending from the main part 47A in an identical layer, the conductor pattern 47A being electrically connected to the conductor pattern 43A at a first part 47B of the extension part (47B, 47E) by a first via-plug 47C, the extension part (47B, 47E) making a contact with the second conductor pattern 43B in a second region 47E away from the first region 47B with regard to the main part 47A of the conductor pattern (47A, 47B, 47E) via a second via-plug (dummy via-plug) 47D, the extension part (47B, 47E) having a first width in the first region 47B and a second width narrower than the first width in the second region 47E, each of the first via-plug 47C and the second via-plug 47D forms a damascene structure.

According to such a construction, there occurs concentration of the vacancies in the second region 47E of the extension parts 47B and 47E, and it becomes possible to induce formation of a void 47X corresponding to the void Y of FIG. 3. Thereby, the contact reliability is improved at the via-plug 47C.

As shown in FIGS. 21A and 21B, it is also possible with the present embodiment to omit the dummy via-plug 47D and the dummy interconnection pattern 43B. In this case, the concentration of the vacancies and formation of the void in the narrow pattern 43E is inducted by the narrowed shape of the pattern 47E, and thus, there is no need of forming the dummy via-plug 47D and the via-plug 47C by dual damascene process, and it is possible to form the dummy via-plug 47D and the via-plug 47C by single damascene process.

Twelfth Embodiment

FIGS. 22A and 22B show the multilayer interconnection structure according to a twelfth embodiment of the present invention respectively in a plan view and in a cross-sectional view, wherein those parts corresponding to the parts explained previously are designated by the same reference numerals and the description thereof will be omitted.

Referring to FIGS. 22A and 22B, the present embodiment has a construction in which the interconnection layer including the interconnection patterns 43A and 43B and the interconnection layer including the interconnection pattern 47A are interchanged in the multilayer interconnection structure explained previously with reference to FIGS. 13A-13C, such that the interconnection patterns 43A and 43B are formed in the interlayer insulation film 47 and the interconnection pattern 47A is formed in the interlayer insulation film 43.

Thus, the multilayer interconnection structure of the present embodiment has the feature of comprising: at least a first interconnection layer formed in the interlayer insulation film 47 and a second interconnection layer formed in the second interlayer insulation film 43 underneath the first inter connection layer, the first interconnection layer comprising a conductor pattern 43A embedded in the interlayer insulation film 47 and constituting a part of an interconnection pattern and another conductor pattern (dummy interconnection pattern) 43B embedded in the interlayer insulation film 47, the second interconnection layer comprising a conductor pattern (47A, 47B, 47E) embedded in the interlayer insulation film 43 and constituting a part of said interconnection pattern, the conductor pattern (47A, 47B, 47E) having a main part 47A and an extension part (47B, 47E) extending from the main part 47A in an identical layer, the conductor pattern (47A, 47B, 47E) being electrically connected to the conductor pattern 43A at a first part 47B of the extension part (47B, 47E) by a first via-plug 47C, the extension part (47B, 47E) making a contact with the second conductor pattern 43B in a second region 47E closer to the main part 47A with regard to the first region 47B via a second via-plug (dummy via-plug) 47D, the extension part (47B, 47E) having a first width in the first region 47B and a second width narrower than the first width in the second region 47E, each of the first via-plug 47C and the second via-plug 47D forms a damascene structure.

According to such a construction, there occurs concentration of vacancies in the region 47E and it becomes possible to induce formation of a void 47X corresponding to the void Y of FIG. 3. Thereby, it becomes possible to improve the reliability of contact in the via-plug 47C.

In this case, too, the concentration of the vacancies to the narrowed pattern 43E is induced by the narrowed shape of the pattern 47E, and thus, there is no need of forming the dummy via-plug 47D and the via-plug 47C by dual damascene process, but it is also possible to form the dummy via-plug 47D and the via-plug 47C by way of single damascene process.

Similarly, it is possible, while illustration is omitted, to improve the reliability of the via-plug 47C even in the case the interconnection layer (47A, 47B, 47F) in the interlayer insulation film 47 and the interconnection layer in the interlayer insulation film 43 are interchanged, by concentrating the vacancies in the tip end part of the branched pattern 47F.

In this case, too, the concentration of the vacancies to the tip end part of the branched pattern 43B is induced by the shape of the branched pattern 47F, and thus, there is no need of forming the dummy via-plug 47D and the via-plug 47C by dual damascene process, and it is also possible to form the dummy via-plug 47D and the via-plug 47C by way of single damascene process.

Similarly, it is also possible, while not illustrated, to interchange the upper and lower interconnection layers with the embodiments of FIGS. 15, 16, 17 and 19.

In this case, too, formation of the dummy via-plug and the via-plug is not limited to dual damascene process but it is also possible to use single damascene process.

Thirteenth Embodiment

Figure 23:
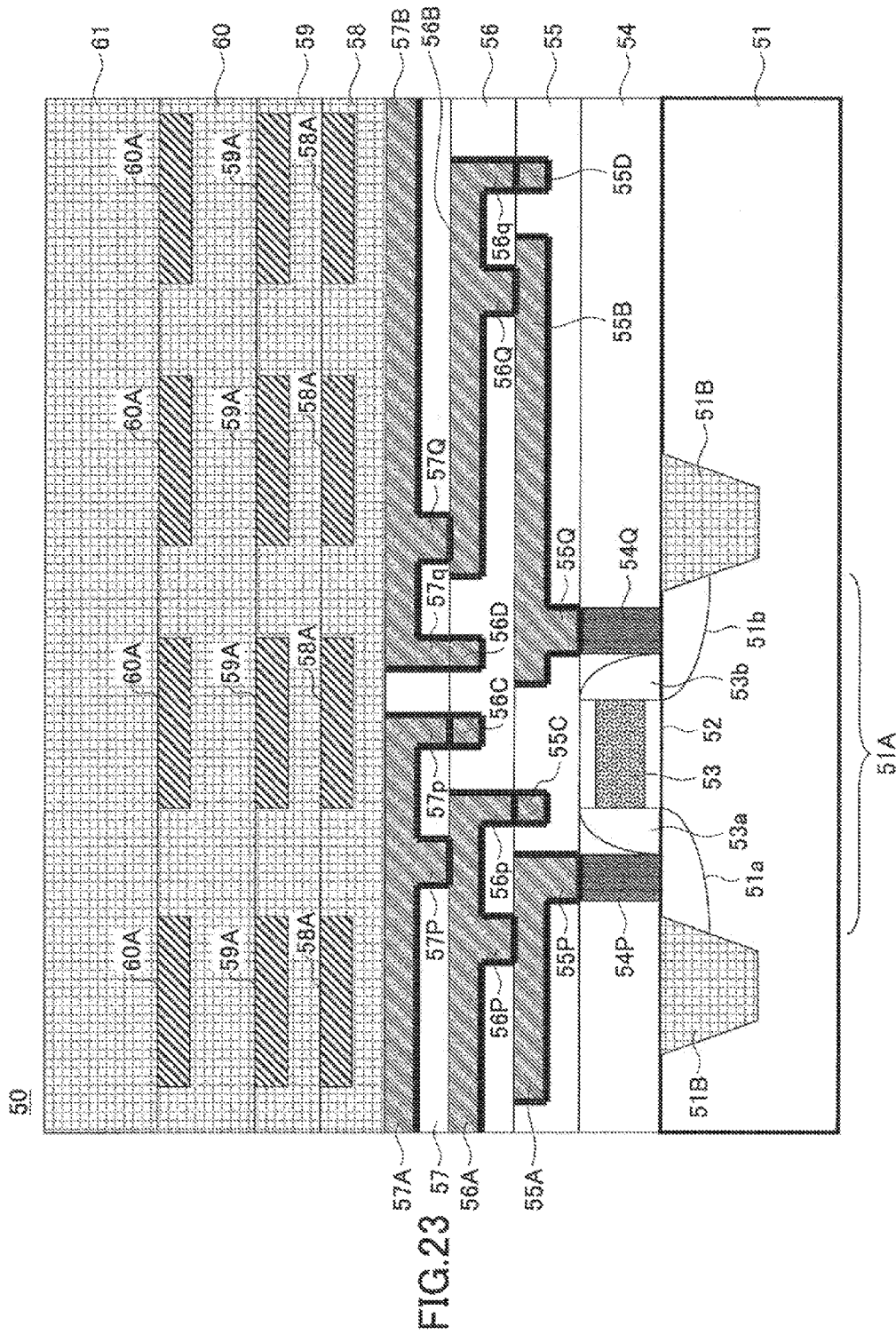
FIG. 23 is a diagram showing the construction of a semiconductor device according to a thirteenth embodiment of the present invention.

FIG. 23 shows the construction of a semiconductor device 50 according to a thirteenth embodiment of the present invention, wherein the semiconductor device 50 has a multilayer interconnection structure of the present invention explained above.

While the illustrated example corresponds to the multilayer interconnection structure explained with reference to the first embodiment, it is possible to use the multilayer interconnection structure of any of the first through tenth embodiments for the semiconductor device 50.

Referring to FIG. 23, the semiconductor device 50 is formed on a device region 51A defined on a Si substrate 51 by a device isolation structure 51B and includes a gate electrode 53 formed on a Si substrate 51 via a gate insulation film 52 and a pair of diffusion regions 51a and 51b formed in respective sides of the gate electrode 53.

The gate electrode 53 has respective sidewall surfaces covered by sidewall insulation films 53a and 53b, and an insulation film 54 such as a PSG film or BPSG film are formed on the Si substrate 51 so as to cover the gate electrode 53 and the sidewall insulation films 53a and 53b.

On the insulation film 54, there is formed an interlayer insulation film 55 of low-K dielectric organic insulation film such as the one marketed by Dow Chemical Company under the trade mark SiLK, and Cu interconnection patterns 55A, 55B and a Cu dummy pattern 55C are formed in the interlayer insulation film 55 with a damascene process. Each of the Cu interconnection patterns 55A and 55B is connected to the diffusion region 51a or 51b electrically by way of a contact plug 54P or 54Q formed in the insulation film 54.

The Cu interconnection patterns 55A and 55B are covered by another similar low-K dielectric organic interlayer insulation film 56 formed on the interlayer insulation film 55, and another similar low-K dielectric organic interlayer insulation film 57 is formed further on the interlayer insulation film 56.

Further, in the illustrated example, Cu interconnection patterns 56A and 56B are embedded in the interlayer insulation film 56 and Cu interconnection patterns 57A and 57B are embedded in the interlayer insulation film 57. Thereby, the interconnection patterns 56A and 56B are connected to the interconnection patterns 55A and 55B respectively via Cu via-plugs 56P and 56Q, while the interconnection patterns 57A and 57B are connected to the interconnection patterns 56A and 56B respectively via Cu via-plugs 57P and 57Q. In the present example, the via-plugs 55P, 55Q, 56P, 56Q, 57P and 57Q are formed by dual damascene process. Further, the thick line defining the Cu interconnection pattern or Cu via-plug in the drawing represents a barrier metal film.

Further, with the constitution of FIG. 23, there are embedded dummy Cu patterns 55 C and 55D in the interlayer insulation film 55, wherein there extend dummy Cu via-plugs 56p and 56q from the respective tip end parts of the Cu interconnection patterns 56A and 56B in contact with the dummy Cu patterns 55C and 55D.

Similarly, there are embedded dummy Cu patterns 56C and 56D in the interlayer insulation film 56, wherein there extend dummy Cu via-plugs 57p and 57q from the respective tip end parts of the Cu interconnection patterns 57A and 57B in contact with the dummy Cu patterns 56C and 56D.

Here, it should be noted that the dummy Cu via-plugs 56p and 56q are formed by a dual damascene process concurrently to the Cu via-plugs 56P and 56Q, while the dummy Cu via-plugs 57p and 57q are formed by a dual damascene process concurrently to the Cu via-plugs 57P and 57Q. Thus, as explained with reference to the previous embodiments, the vacancies in Cu interconnection patterns 56A and 56B or 57A and 57B are concentrated to such dummy Cu plugs, leading to improvement of stress migration resistance in the Cu via-plugs 56P and 56Q or 57P and 57Q.

Further, in the illustrated example, there are laminated SiOC interlayer insulation films 58, 59 and 60 consecutively on the interlayer insulation film 57, and an interconnection pattern 58A of Cu or Al is embedded in the interlayer insulation film 58. Similarly, an interconnection pattern 59A of Cu or Al is embedded in the interlayer insulation film 59 and an interconnection pattern 60A of Cu or Al is embedded in the interlayer insulation film 60. In FIG. 23, it should be noted that the interconnection patterns of the interlayer insulation films 58, 59 and 60 are shown collectively by using the same reference numeral for each layer.

The interconnection patterns 58A, 59A and 60A are connected electrically with each other by via-plugs not illustrated, while the interconnection pattern 58A is connected to any of the interconnection patterns 57A and 57B by a via-plug not illustrated.

Further, with the structure of FIG. 23, there is formed a next interlayer insulation film 61 on the interlayer insulation film 60 and it is also possible to form a next interconnection pattern in the interlayer insulation film 61.

Further, with the semiconductor device 50 of FIG. 22, the multilayer interconnection structure is not limited to the one that we explained with the first embodiment and it is also possible to use the multilayer interconnection structure explained with the reference to the second through tenth embodiments.

While the present invention has been explained for preferred embodiments, the present invention is by no means limited to the embodiments described heretofore, but various variations and modifications may be made without departing from the scope of the invention.

What is claimed is:

1. A semiconductor device comprising:
   a substrate;
   a first interlayer insulation film formed above said substrate;
   a first conductor pattern formed in said first interlayer insulation film and a second conductor pattern formed in said first interlayer insulation film, said second conductor pattern being separated from said first conductor pattern in a plan view;
   a second interlayer insulation film formed above said first insulation film;
   a third conductor pattern formed in said second interlayer insulation film;
   an extension part formed in said second interlayer insulation film and connected to said third conductor pattern in a plan view, a width of said extension part being narrower than a width of said third conductor pattern;
   a first via-plug formed on said first conductor pattern and under said extension part;
   a branched pattern formed in said second interlayer insulation film and connected to said extension part in a plan view; and
   a second via-plug formed on said second conductor pattern and under said branched pattern.

2. The semiconductor device as claimed in claim 1, wherein said third conductor pattern, said extension pattern, said branched pattern, said first via-plug and said second via-plug form a dual damascene structure together with said second interlayer insulation film.

3. The semiconductor device as claimed in claim 1, wherein said extension part and said branched pattern are located out of the said third conductor pattern in a plan view.

4. The semiconductor device as claimed in claim 1, wherein a distance from said third conductor pattern to said second via-plug via said extension part and said branched pattern is shorter than a distance from said third conductor pattern to said first via-plug via a part of said extension part and said branched pattern in a plan view.

* * * * *